(12) United States Patent
Kosugi

(10) Patent No.: US 6,549,425 B1
(45) Date of Patent: Apr. 15, 2003

(54) ELECTRONIC APPARATUS WITH SEPARATING PLATE TO SECURE ELECTRONIC COMPONENT

(75) Inventor: Naofumi Kosugi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/649,136

(22) Filed: Aug. 28, 2000

(30) Foreign Application Priority Data

Sep. 30, 1999 (JP) .......................................... 11-279418

(51) Int. Cl.⁷ ................................................ H05K 7/02

(52) U.S. Cl. ....................... 361/809; 361/810; 361/759; 361/820; 248/316.4; 439/327; 439/368

(58) Field of Search ................................. 361/809, 810, 361/808, 807, 825, 753, 728, 759, 683; 211/41.17; 206/706; 248/316.4, 316.1, 354.1, 354.3; 439/327, 368

(56) References Cited

U.S. PATENT DOCUMENTS

| 5,383,793 A | * | 1/1995 | Hsu et al. | 439/327 |
| 5,694,291 A | * | 12/1997 | Feightner | 361/683 |
| 5,754,406 A | * | 5/1998 | Hardt et al. | 361/756 |

\* cited by examiner

Primary Examiner—David Martin
Assistant Examiner—Hung Bui
(74) Attorney, Agent, or Firm—Armstrong, Westerman & Hattori, LLP

(57) ABSTRACT

An electronic apparatus has a casing, electrically insulating separating plates arranged in the casing, electronic components arranged in proximity to the separating plate, and a securing member. The separating plate has latch regions each having a top and latch grooves below the top. The securing member is snap-fitted on the latch region and has a pawl engaged with the latch grooves and a securing portion to secure the upper edge of the electronic component. The separating plate electrically insulates one electronic component from another electronic component. The latch regions have different heights.

18 Claims, 25 Drawing Sheets

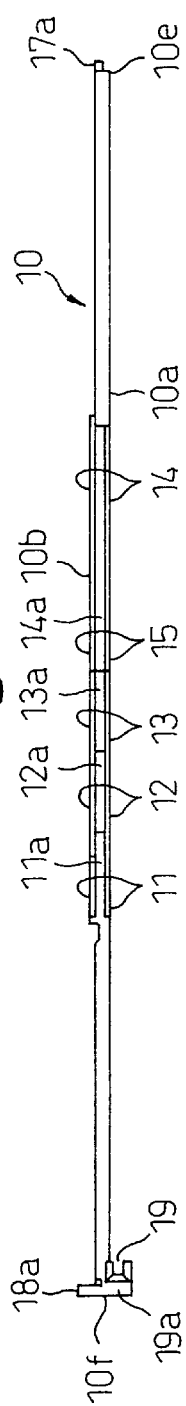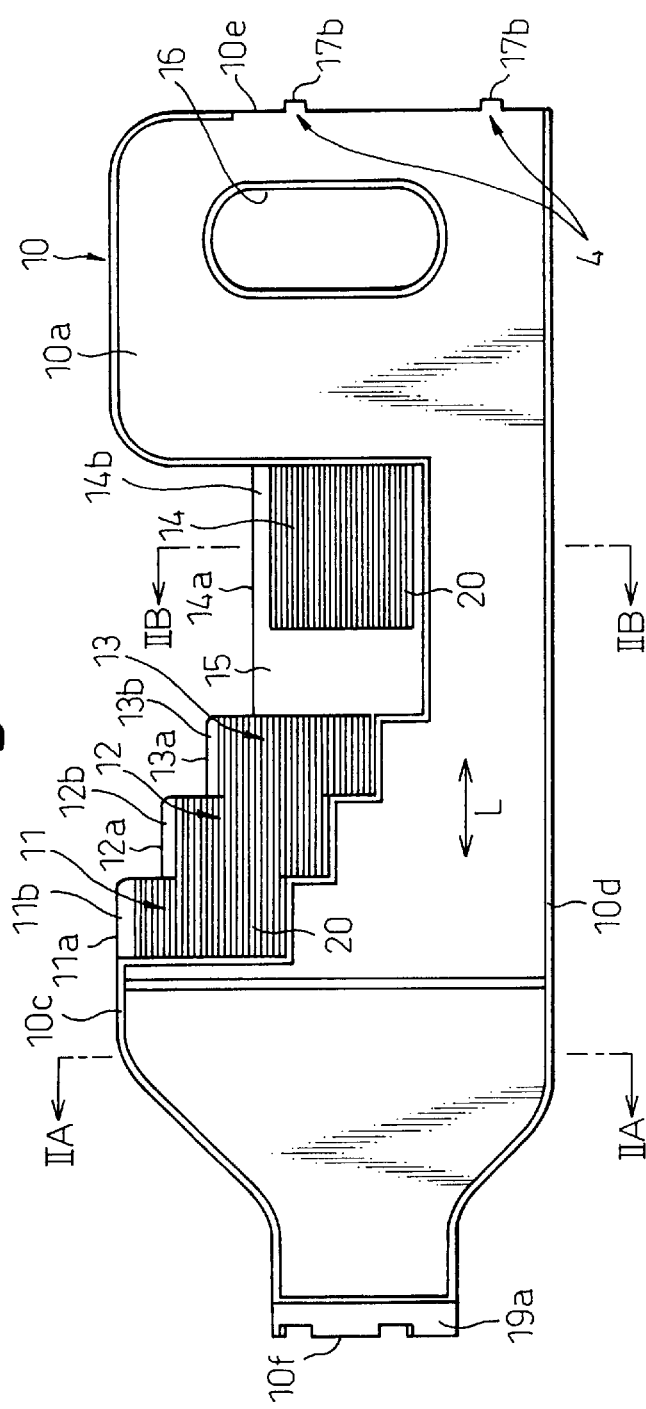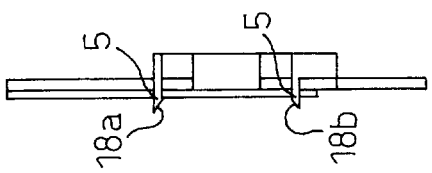

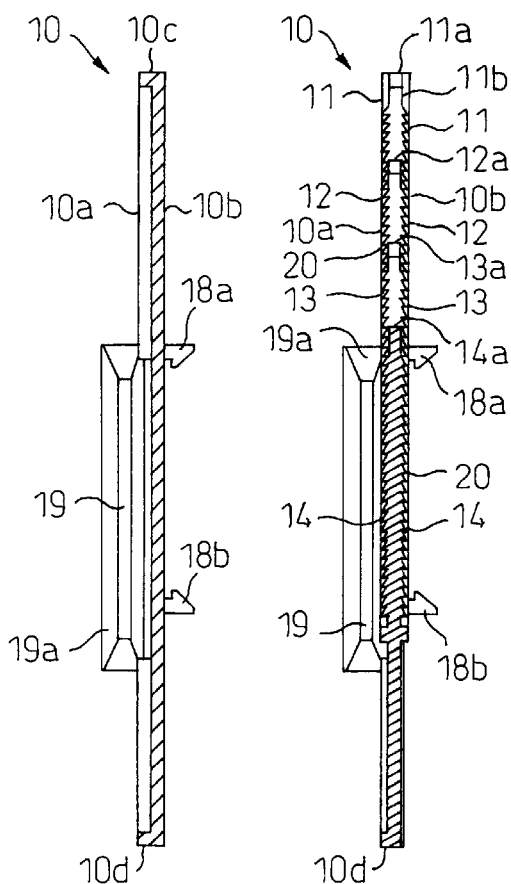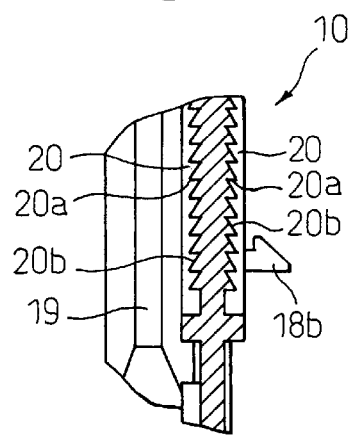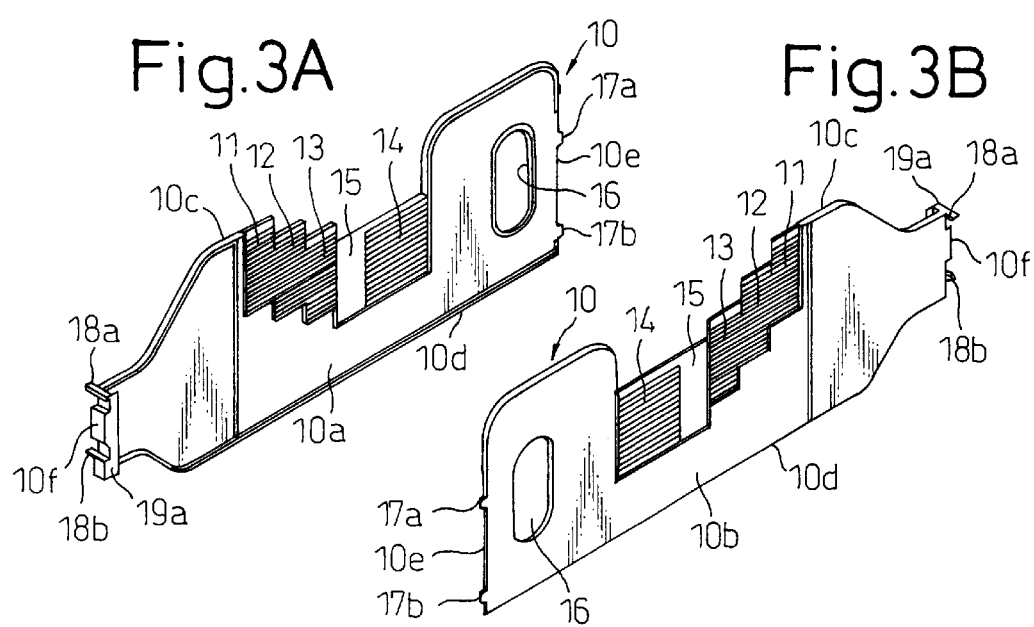

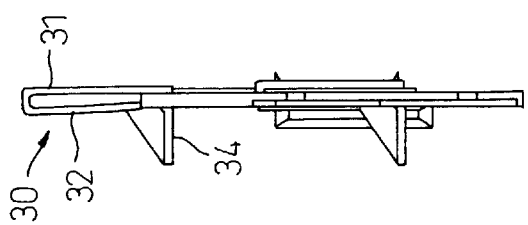
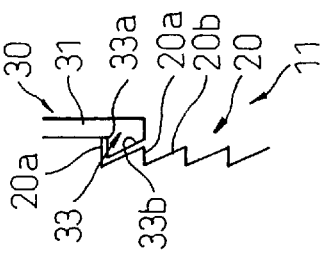
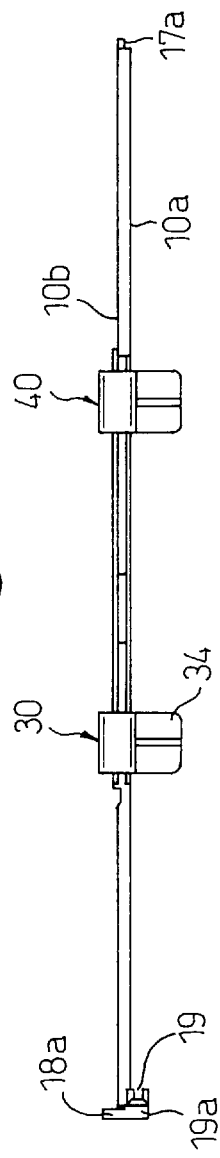
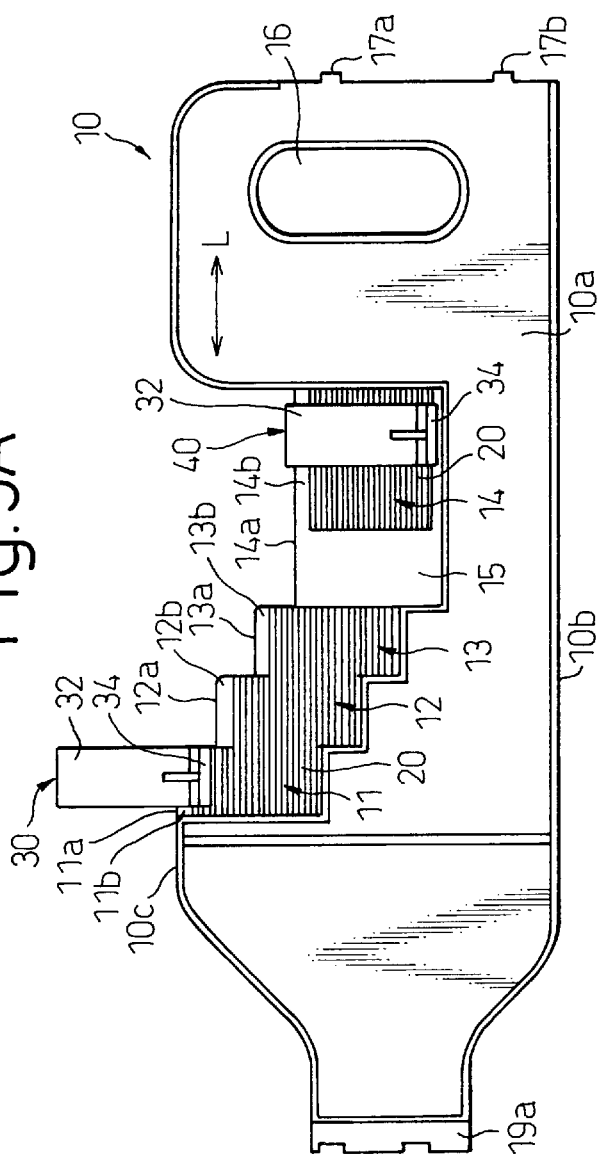

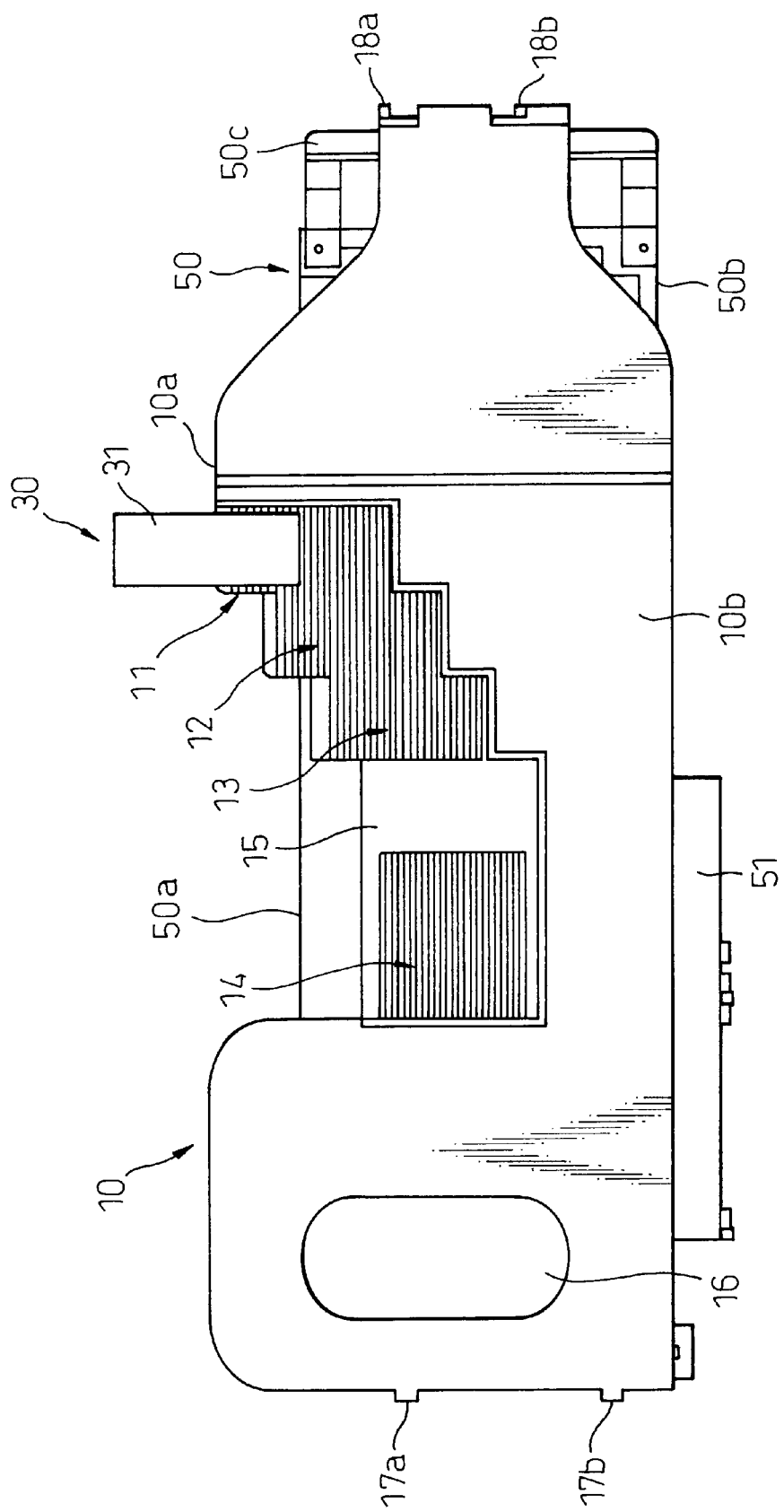

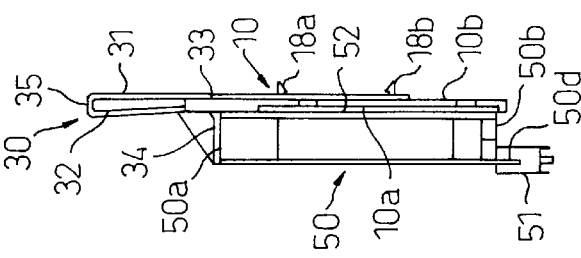
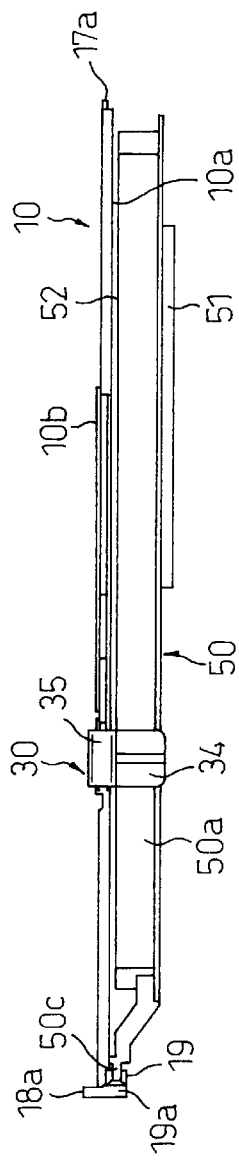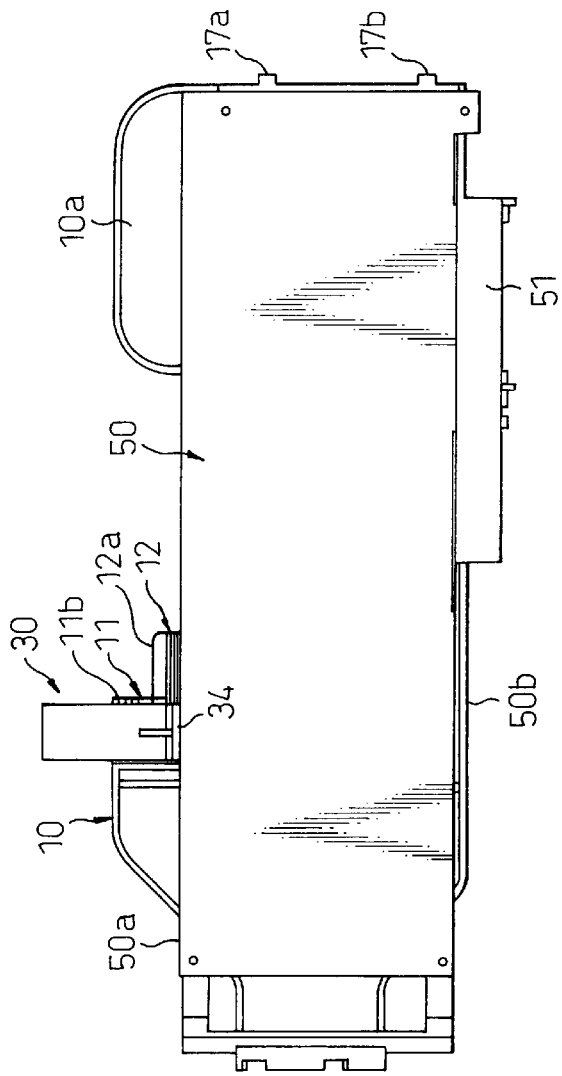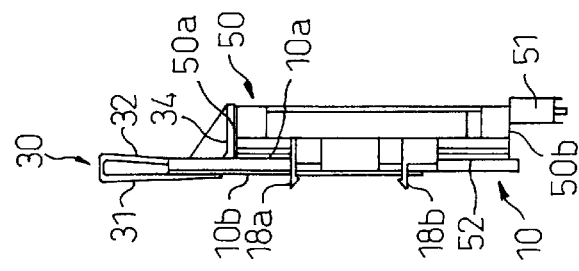

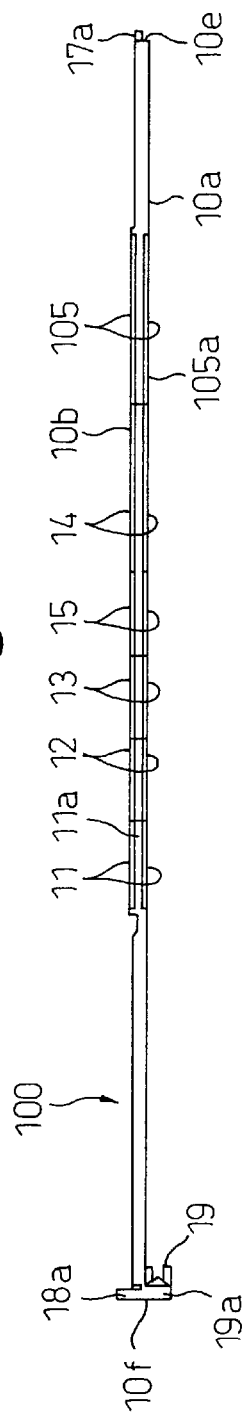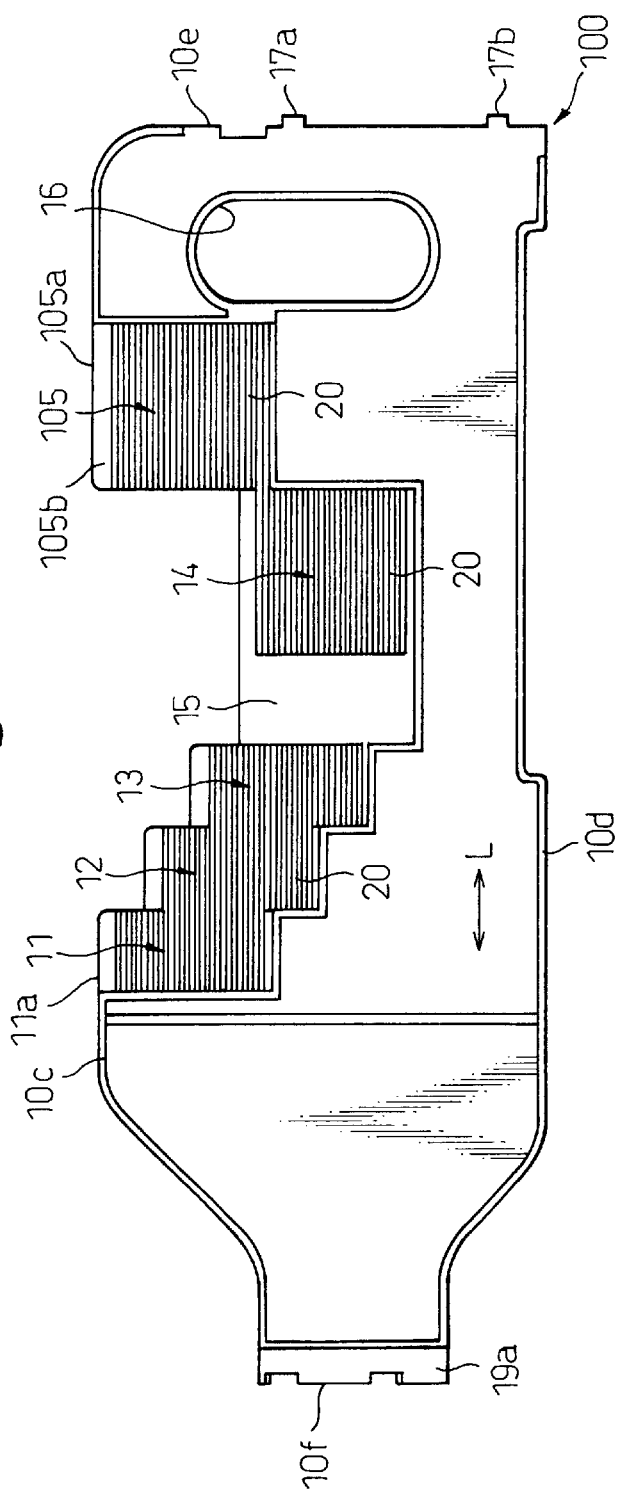

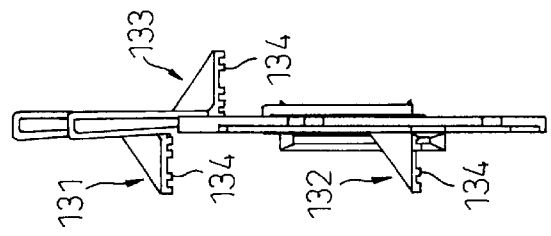
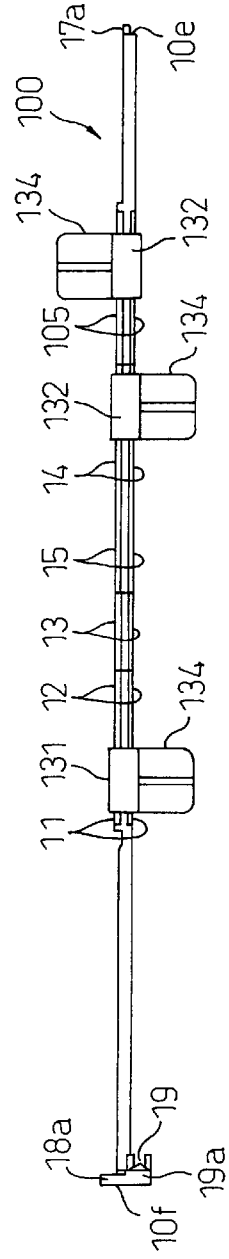
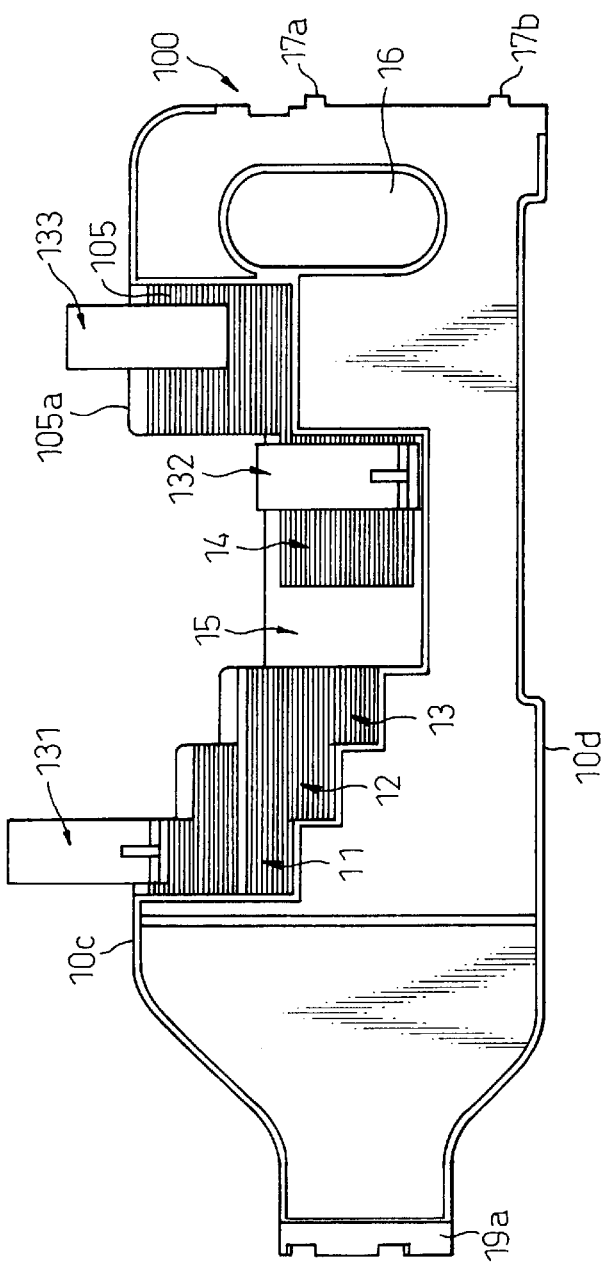

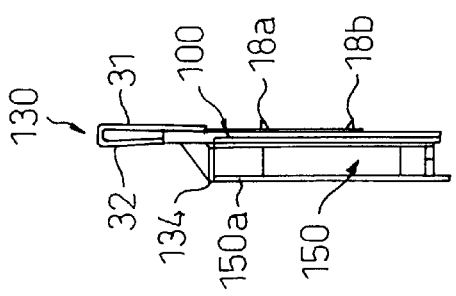
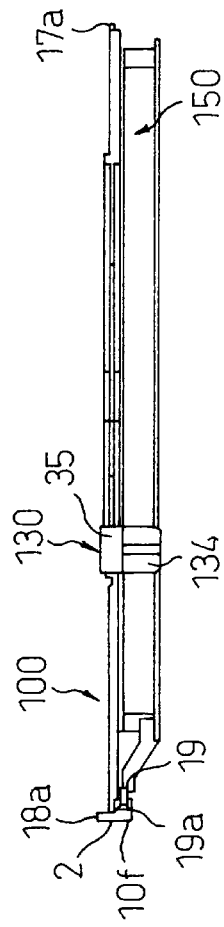
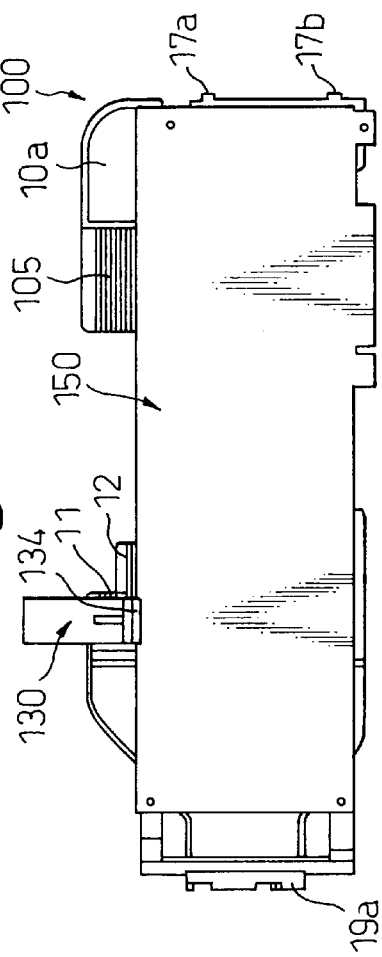
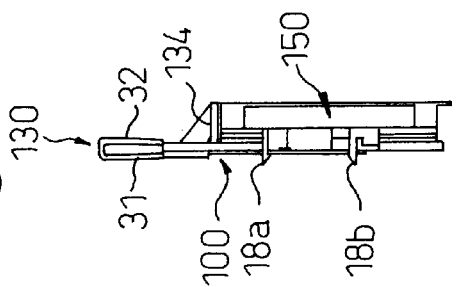

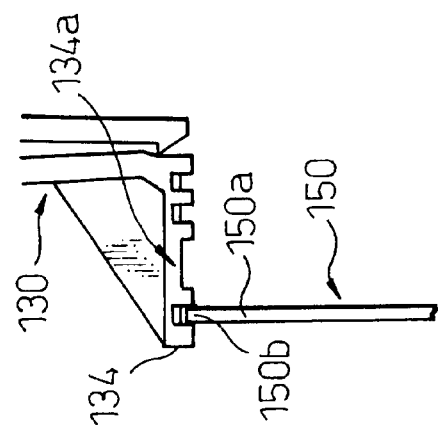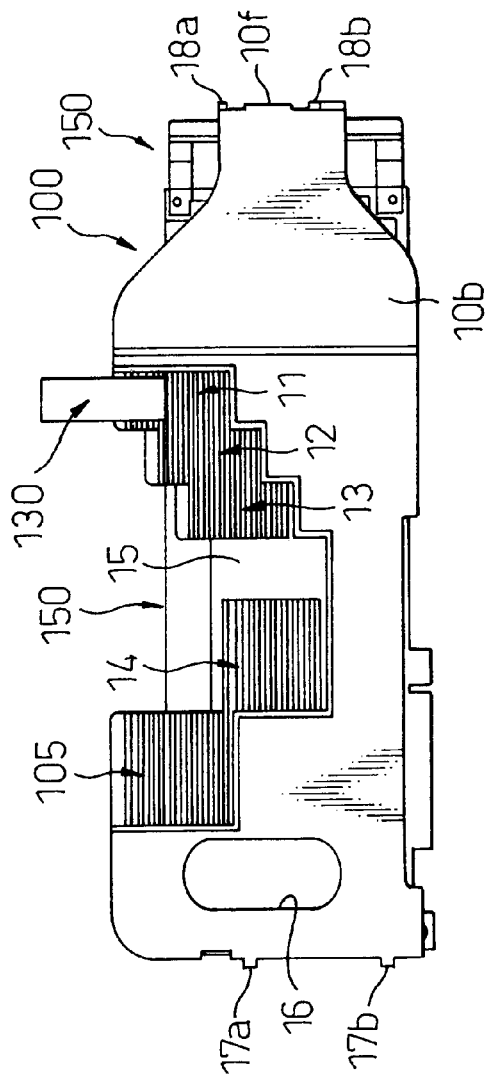

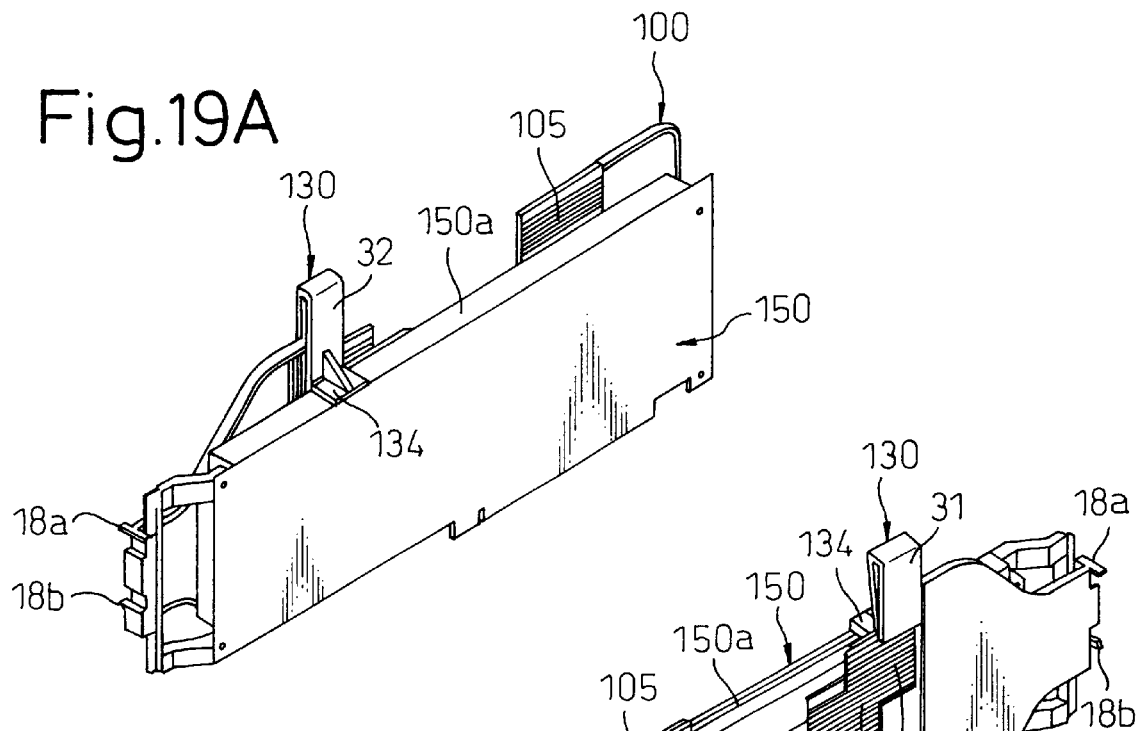
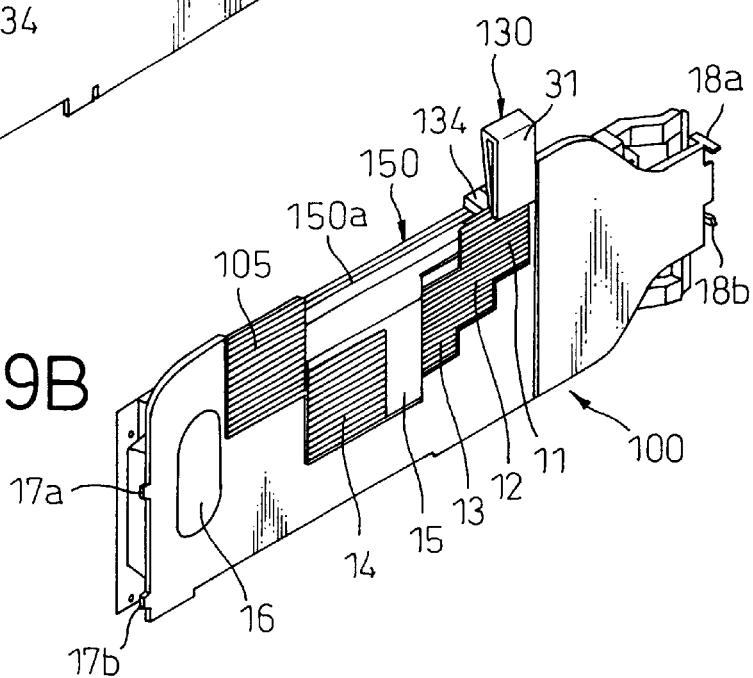

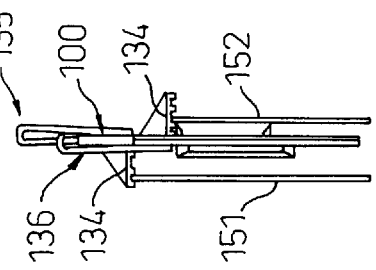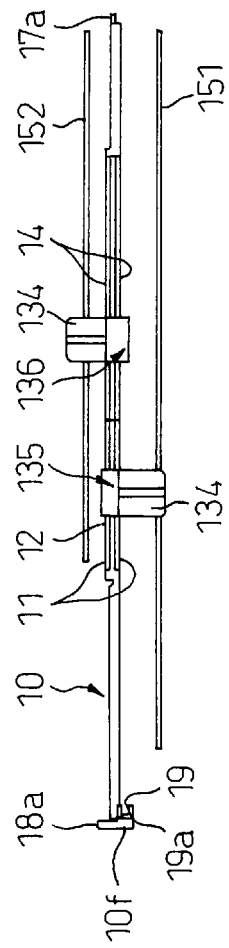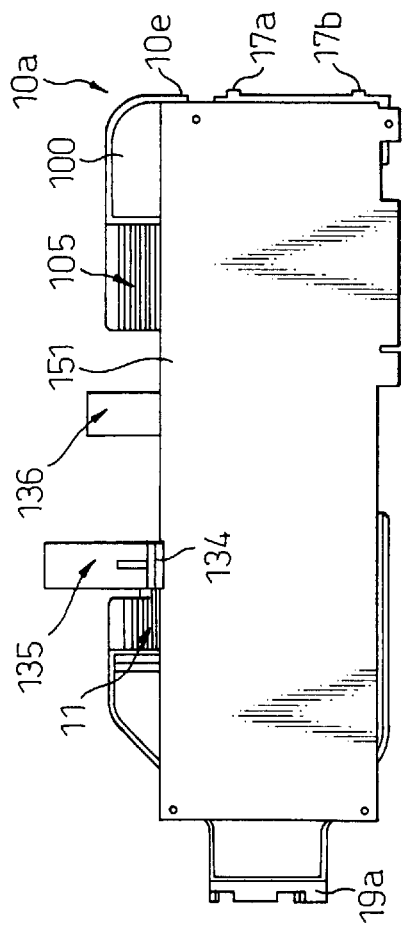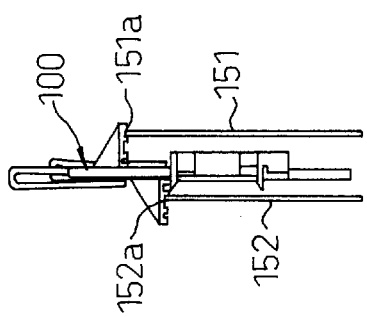

ELECTRONIC APPARATUS WITH SEPARATING PLATE TO SECURE ELECTRONIC COMPONENT

BACKGROUND OF THE INVENTION

1. Field of the Invention

The present invention relates to an electronic apparatus such as a personal computer (PC) or a server having a separating plate for securing an electronic component, such as an I/O card, and to electrically insulatively separate the latter from another. In particular, the preset invention relates to such a separating plate, a securing member fitted on the separating plate and a separating structure for separating two electronic components.

2. Description of the Related Art

Each PCI card, or another I/O card such as an EISA card, mounted in an electronic apparatus such as a personal computer or a server is fitted in the connector in the electronic apparatus, and in this condition, the electronic apparatus is shipped from the factory. The electronic component such as the I/O card, however, may come out of the connector into what is called the "loosened condition" due to vibration to which the electronic component is exposed during the shipment or transportation. This loosened condition may also occur if the electronic apparatus is frequently moved while in use. An example of a structure for securing the electronic components of the conventional electronic apparatus to prevent this loosened condition of the I/O card, etc. will be explained with reference to FIG. 13 in the attached drawings.

As shown in FIG. 13, I/O cards 3a, 3b and 3c of different height are fitted in connectors 2 fixed to a casing 1 of an electronic apparatus. L-shaped securing members 5a, 5b and 5c are arranged above the I/O cards 3a to 3c, respectively. The bottom portion 5d of each securing member is in contact with the upper end 9 of each I/O card through a sponge 4. A support bar 6 is fixed to a support frame of the casing 1 by screws 8 at the ends thereof at the upper part of the casing 1. The upper end of each of the securing members 5a to 5c is fixed by a screw 7 to the support bar 6. A plurality of I/O cards 3a to 3c fitted in the connectors 2 in this way are secured at the upper ends 9 thereof by the securing members 5a to 5c, thereby preventing the I/O card from being loosened.

In recent years, various types of industrial equipment have been operated continuously, and computers for office use are often used continuously for batch processing. Thus, the servers and the personal computers attached to these equipments are also run continuously. Switching off the power supply of the server or the like at the time of maintenance or inspection, therefore, constitutes the loss of time and reduces productivity. For this reason, various maintenance operations on servers or the like are often conducted without switching off the power supply, and so the electronic components, such as I/O cards, must be replaced without switching off the power supply. An increased size of the server and the resulting increase in the chance of connecting to a multiplicity of external units, on the other hand, gives rise to a demand for a great variety of interfaces in greater numbers, and I/O cards as interfaces are to be added. Further, continuous operation causes the electronic components to be replaced with a comparative greater frequency.

In changing or adding an I/O card using the conventional securing structure of an electronic component shown in FIG. 13, the securing member 5a is removed by loosening the screw 7 for changing the I/O card 3a, for example. In the process, the screw 7 may be carelessly dropped in the casing 1. If the screw 7 thus dropped falls on the substrate such as the mother board located at a lower portion in the casing 1, for example, a short circuit or the like trouble may occur undesirably. Also, the worker's hand may touch the adjacent I/O card 3b thereby posing the problem of interference with an I/O card which is not to be changed.

With an electronic apparatus such as a server, an improved workability and safety at the time of changing or adding an electronic component is required to avoiding accidents such as those described above. For this purpose, a structure is required in which an electronic component is positively insulated electrically and fixedly secured without using any screws or the like.

The conventional structure for securing the electronic component of the electronic apparatus shown in FIG. 13 also involves a great number of parts, requires a great number of steps for assembly and has a low cost effectiveness. Further, the requirement for a multiplicity of interfaces and the use of a great variety of sizes of the I/O card requires, in the case of FIG. 13, the securing members 5a, 5b and 5c of different lengths, leading to a higher parts cost. In view of this, a simple securing structure is required which can secure an I/O card or the like of any size.

SUMMARY OF THE INVENTION

A first object of the present invention is to provide a separating plate, a securing member, a separating structure for an electronic component and an electronic apparatus in which the electronic component can be positively secured and fixed while being electrically insulated from an adjacent electronic component on the one hand, and can be changed or added with an improved workability and safety on the other hand.

A second object of the invention is to provide a separating plate, a securing member, a securing structure for an electronic component and an electronic apparatus in which the electronic component can be positively secured and fixed and can be easily replaced even in the case where the size of an electronic component is changed.

A third object of the invention is to provide a separating plate, a securing member, a separating structure for an electronic component and an electronic apparatus having a simple configuration to permit both the parts cost and the number of assembly steps to be reduced.

In order to achieve the above-mentioned objects, according to one aspect of the present invention, there is provided a separating plate comprising a plate member made of an electrically insulating material, the plate member having opposite surfaces and at least one latch region having a first latch member formed in at least one of the opposite surfaces, the plate member being constructed such that a securing member having a second latch member can be fitted on the latch region and the second latch member can engage with the first latch member to secure an electronic component arranged in proximity to the plate member.

With this separating plate, the electronic component can be separated and electrically insulated from another electronic component by means of the electrically insulating plate member. In application to an electronic apparatus, therefore, the interference with another electronic component can be avoided at the time of changing or adding the electronic components. Thus, it becomes possible, for example, to conduct the work of changing or adding the electronic component while keeping the power supply of the electronic apparatus on for an improved workability and an improved safety. Also, the first latch member includes a plurality of grooves and the second latch member includes a protrusion or a pawl, for example, to form a latch structure, whereby the securing member, upon fitting on the latch area, moves freely in the direction of fitting but not in the reverse direction. Therefore, the securing member, when inserted until it comes into contact with an end of an electronic component, stops there and can fixedly secure the electronic component positively. The latch region can be formed on one or both of the surfaces of the plate member.

Preferably, the plate member has an upper edge and the latch region has a top corresponding to the upper edge, the latch grooves being arranged below the top so that the securing member can be fitted on the latch region in a first direction from the top toward the latch grooves, the latch grooves being configured such that the pawl can be moved beyond some of the latch grooves in the first direction but cannot be moved beyond the latch grooves in a second direction opposite to the first direction, and can slide along one of the latch groove for removal of the securing member from the plate member.

A plurality of latch regions are provided, each of the latch regions having a top and the plurality of latch grooves, the top of one latch region and the top of the adjacent latch region being formed at different heights so as to form a step.

Therefore, different latch regions have different heights, which makes it possible to fixedly secure electronic components of various sizes and different heights.

Also, by forming a guide rail portion integrally with the plate member for the electronic component, any electronic component which may be arranged in proximity can be guided and supported by the guide rail portion. The guide rail portion, which is formed integrally with the plate member as described above, need not be arranged specifically as an independent member unlike in the prior art. Thus, the structure can be simplified while at the same time reducing both the number of required parts and the number of assembly steps as well as the parts cost. The guide rail portion may be formed on both surfaces instead of one surface of the plate member. The provision of the guide rails on both sides permits the electronic components on the two sides to be efficiently supported.

Further, an opening is provided in the plate member, through which the electronic component arranged in proximity to the plate member can be grasped. By doing so, the mounting and demounting of adjacent electronic. components, especially the electronic components comparatively low in height, is facilitated, thereby desirably facilitating the work of changing or adding parts.

Also, a non-latch region, with no latch member, can be formed in proximity to the latch region, so that the securing member can slide toward the non-latch portion along the first latch member. By doing so, the securing member can be easily removed by pulling it off from the separating plate after being slid to the non-latch region, thereby simplifying the work of changing the electronic components. Further, the latch structure can be easily released without causing unnecessary vibrations, and therefore the other precision parts of the electronic apparatus are not adversely affected when changing the electronic components.

According to another aspect of the invention, there is provided a separating structure comprising a separating plate, a securing member, and two electronic components arranged in proximity to the separating plate on either side thereof; the separating plate comprising a plate member made of an electrically insulating material to separate the two electronic components from each other in an electrically insulated manner, the plate member having opposite surfaces and at least one latch region having a first latch member formed in at least one of the opposite surfaces; the securing member having a second latch member and a securing portion to secure the electronic component; and the plate member being constructed such that the securing member can be fitted on the latch region and the second latch member can engage with the first latch member to secure at least one of the electronic components. As a result, a structure capable of electrically insulating two electronic components positively from each other is provided, and the effects described above can be exhibited by such a structure. Also, the latch structure constituted of the separating plate and the securing member can fixedly hold the electronic component positively with a simple structure, thereby making it possible to reduce the number of assembly steps and the cost.

The configuration of an electronic apparatus having a separating plate or a separating structure for an electronic component leads to the various effects described above. Also, the arrangement of the separating plate in the electronic apparatus is not specially disadvantageous in terms of space utilization. Further, in the case where air for cooling or heat insulation is sent into the electronic apparatus utilizing the space between the electronic component and the separating plate, the separating plate and the separating structure described above can exhibit the function as air regulation means.

According to still another aspect of the invention, there is provided a securing member fitted on a separating plate for securing an electronic component. The securing member permits the electronic component arranged in proximity to the separating plate to be positively held and fixed.

According to yet another aspect of the invention, there is provided an electronic apparatus comprising a separating plate comprising a plate member of an electrically insulating material formed with at least one latch region having a first latch member on at least one of the surfaces of the plate member, and a securing member including a second latch member adapted to engage the first latch member and a securing portion, which is located in proximity to the separating plate and adapted to come into contact with and secure the electronic component arranged in the casing, wherein the securing member is fitted on the latch region so that the securing portion comes into contact with the electronic component and the second latch member engages with the first latch member, with the result that the securing member fixedly secures the electronic component.

Also, the aforementioned configuration in which the securing member secures two electronic components arranged on either side of the separating plate makes it possible to secure two adjacent electronic components with a single securing member thereby desirably reducing the number of parts.

Further, the securing member includes a pair of first and second panels opposed to each other and coupled to each other at respective one ends with the other ends thereof open, wherein the second latch member is formed on the inner surface of the other end of the first panel, and the securing portion protrudes outward from at least one of the first and second panels. In this configuration, the securing member can be fitted on the latch region of the separating plate by way of the opening between the first and second panels, and therefore the latch structure can be easily formed while at the same time greatly facilitating the assembly work for securing and fixing the electronic component. The securing portion can be arranged either on both or only one of the two panels.

Also, the separating plate can be arranged in the casing by a configuration in which the separating plate may be flexible and an engaging portion may be arranged at the side end of the plate member to engage with the engaging portion of the casing. Then, when the separating plate is displaced while the engaging portion of the plate member is positioned at the engaging portion of the casing and loosened to the original state. Thus, the engaging portion of the plate member comes to engage with the engaging portion of the casing. Thus, the separating plate can be fixedly arranged positively in the casing without using any screws unlike in the prior art. The engaging portion of the separating plate is desirably formed at the two side ends of the separating plate.

In another configuration, a plurality of connectors for replacing the electronic component are arranged in the casing, the separating plate is arranged between a connector and an adjacent connector, and the electronic component is mounted on the connector. By doing so, when the electronic component is mounted in an unoccupied connector, the electronic component can be positively and easily electrically insulated, held and fixed.

BRIEF DESCRIPTION OF THE DRAWINGS

The present invention will become more apparent from the following description of the preferred embodiments, with reference to the accompanying drawings, in which:

FIGS. 1A to 1C show a separating plate according to an embodiment of the present invention, in which FIG. 1A is a front view, FIG. 1B is a side view, and FIG. 1C is a plan view, of the separating plate;

FIG. 2A is a sectional view of the separating plate, taken along the line IIA—IIA in FIG. 1A;

FIG. 2B is a sectional view of the separating plate, taken along the line IIB—IIB in FIG. 1A;

FIG. 2C is a partly enlarged sectional view of FIG. 2B;

FIG. 3A is a perspective view of the separating plate viewed from the same side as in FIG. 1A;

FIG. 3B is a perspective view viewed from the opposite side of FIG. 1A;

FIGS. 4A to 4E show a securing member adapted to be fitted on the separating plate of FIGS. 1A to 1C, in which FIG. 4A is a perspective view, FIG. 4B is a perspective view viewed from the opposite side of FIG. 4A, FIG. 4C is a side view, FIG. 4D is a front view, and FIG. 4E is a plan view of the securing member;

FIGS. 5A to 5D show the separating plate of FIGS. 1A to 1C, with the securing member of FIGS. 4A to 4E mounted thereon, in which FIG. 5A is a front view, FIG. 5B is a plan view, FIG. 5C is a side view, and FIG. 5D is a partly enlarged side view, showing in detail the latch structure with the latch portions engaged;

FIG. 6 is a rear view of a separating structure of an electronic component arranged in proximity to the separating plate;

FIGS. 8A to 8D show the separating structure of FIG. 6, in which FIG. 8A is a front view, FIG. 8B is a plan view, FIG. 8C is a left side view, and FIG. 8D is a right side view, of the separating structure;

FIGS. 9A and 9B show a modification of the separating structure shown in FIGS. 6 to 8D for an electronic component comparatively low in height, in which FIG. 9A is a rear view, and FIG. 9B is a front view, of the separating structure;

FIGS. 10A to 10C show a casing of an electronic apparatus as an example of the separating structure of FIGS. 6 to 8D applied to the electronic apparatus, in which FIG. 10A is a plan view, FIG. 10B is a front view, and FIG. 10C is a rear view, of the casing;

FIGS. 14A to 14D show a modified securing member, in which FIG. 14A is a perspective view, FIG. 14B is a front view, FIG. 14C is a side view, and FIG. 14D is a plan view, of the securing member;

FIG. 15A is a front view of a modified separating plate;

FIG. 15B is a plan view of the separating plate of FIG. 15A;

FIGS. 17A to 17C show the separating plate of FIGS. 15A to 16 with the securing member of FIGS. 14A to 14D mounted thereon, in which FIG. 17A is a front view, FIG. 17B is a plan view, and FIG. 17C is a side view, of the separating plate;

FIGS. 18A to 18F show a separating structure of an electronic component arranged in proximity to the separating plate of FIGS. 15A to 16 and fixedly secured by the second securing member of FIGS. 14A to 14C, in which FIG. 18A is a rear view, FIG. 18B is a plan view, FIG. 18C is a left side view, FIG. 18D is a right side view, FIG. 18E is a front view, and FIG. 18F is a partly enlarged right side view, of the separating structure;

FIG. 19A is a perspective view of the separating structure of FIGS. 18A to 18F viewed from the same side as FIG. 18A;

FIG. 19B is a perspective view of the separating structure viewed from the opposite, front side of FIG. 18A;

FIGS. 20A to 20F show the separating structure of two electronic components arranged in proximity to the separating plate of FIGS. 15A to 16 between the two electronic components and fixedly secured by the securing member of FIGS. 14A to 14C in which FIG. 20A is a rear view, FIG. 20B is a plan view, FIG. 20C is a left side view, FIG. 20D is a right side view, FIG. 20E is a front view, and FIG. 20F is a partly enlarged right side view;

FIGS. 22A to 22E show a modified securing member, in which FIG. 22A is a perspective view, FIG. 22B is a front view, FIG. 22C is a left side view, FIG. 22D is a right side view, and FIG. 22E is a plan view, of the securing member;

FIGS. 23A to 23E show a separating structure of an electronic component arranged in proximity to the separating plate of FIGS. 15A to 16 and fixedly secured by the securing member of FIGS. 22A to 22E, in which FIG. 23A is a rear view, FIG. 23B is a plan view, FIG. 23C is a left side view, FIG. 23D is a right side view, and FIG. 23E is a front view, of the separating structure;

DESCRIPTION OF THE PREFERRED EMBODIMENTS

Figure 4A:
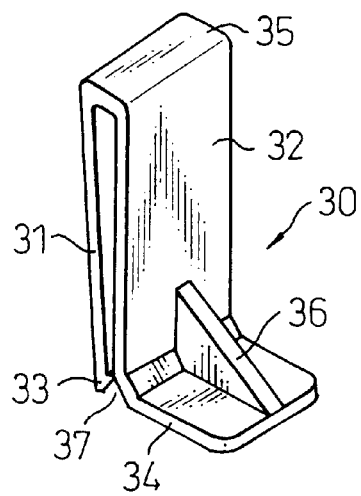

Preferred embodiments of the present invention will now be explained below with reference to the drawings. FIGS. 1A to 1C show a separating plate 10 according to the embodiment of the present invention, in which FIG. 1A is a front view, FIG. 1B is a side view, and FIG. 1C is a plan view, of the separating plate 10. AS shown in FIGS. 1A to 1C, the separating plate 10 is formed, as a whole, from a substantially rectangular flexible plastic plate member and has a length determined according to a size of a casing of an electronic apparatus to which the present invention is applied. The plate member has opposite flat surfaces 10a and 10b, an upper edge 10c, a bottom edge 10d, and side edges 10e and 10f. An electronic component such as an I/O card is arranged substantially in opposed relation with and parallel to the surface 10a or 10b. The plate member is made of an electrically insulating material such as a resin, an ABS resin for example, but other electrical insulating materials may be used with equal effect.

A plurality of latch regions 11, 12, 13 and 14 are arranged in the substantially central portion of each of the surfaces 10a and 10b of the separating plate 10. The first latch region 11 has a first top 11a corresponding to the upper edge 10c of the plate member, and extends below the first top 11a with a predetermined vertical width and a predetermined longitudinal width, via a securing member introducing portion 11b where no latch member is provided. The second latch region 12 has a second top 12a at a height lower than the first top 11a so as to form a step with the first top 11a, and extends below the second top 12a with a predetermined vertical width and a predetermined longitudinal width, via a similar securing member introducing portion 12b. The third latch region 13 has a third top 13a at a height lower than the second top 13a so as to form a step with the second top 12a, and extends with a predetermined vertical width and a predetermined longitudinal width, a similar securing member introducing portion 13b. The fourth latch region 14 has a fourth top 14a at a height lower than the third top 13a so as to form a step with the third top 13a, and extends with a predetermined vertical width and a predetermined longitudinal width, via a similar securing member introducing portion 14b. The first to third latch regions 11 to 13 are continuously arranged, and a non-latch region 15 is provided between the third and fourth latch regions 13 and 14.

FIG. 2A is a sectional view of the separating plate 10 taken along the line IIA—IIA in FIG. 1A, FIG. 2B is a sectional view taken along the line IIB—IIB in FIG. 1A, and FIG. 2C is a partly enlarged sectional view of FIG. 2B. The first to fourth latch regions 11 to 14 have a plurality of linear, parallel latch grooves or projections 20 extending in the longitudinal direction L (FIG. 1A) as first latch members of the first to fourth latch regions 11 to 14. As shown in FIGS. 2B and 2C, each of the latch grooves 20 is formed with a horizontal wall portion 20a substantially perpendicular to the surfaces 10a and 10b of the plate member and an inclined wall portion 20b extending from the bottom of the horizontal portion 20a toward the surface at an angle. The horizontal wall portions 20a and the inclined wall portions 20b are alternately repeated. Some of the latch grooves 20 continuously extend in the longitudinal direction L over the first to third latch regions 11 to 13.

The non-latch region 15 formed between the third latch region 13 and the fourth latch region 14 has no latch groove. The non-latch region 15 is substantially a plane containing the bottoms of the horizontal wall portions 20a of the latch grooves 20.

FIG. 3A is a perspective view of the separating plate 10 viewed from the same side as FIG. 1A and FIG. 3B is a perspective view viewed from the opposite side of FIG. 1A. As shown in FIGS. 3A and 3B, the first to fourth latch regions 11 to 14 and the non-latch region 15 are formed at the same positions on the two surfaces 10a and 10b of the separating plate 10, but they may be formed only on one of the surfaces.

Also, an oblong opening 16 elongated toward the upper edge 10c and the bottom edge 10d is formed in the separating plate 10 near one side edge 10e. The opening 16 is formed in such a size that an electronic component which may be arranged in proximity to the separating plate 10 can be grasped through it.

A pair of engaging claws 17a and 17b are formed on one side edge 10e and engaging claws 18a and 18b are formed on the other side edge 10f, as engaging members for mounting the separating plate 10 on the casing of the electronic apparatus. The engaging claws 17a and 17b protrude from the side edge 10e in longitudinal direction L, while the engaging claws 18a and 18b protrude from the surface 10b in the direction substantially perpendicular to the surface 10b at the other side edge 10f. The engaging claws 17a–17b and 18a–18b are used to engage with corresponding engaging portions of the casing of the electronic apparatus for mounting the separating plate 10 in the casing.

The height of the upper edge 10c of a portion of the separating plate 10 near the side edge 10e thereof is substantially the same as that of a portion of the separating plate 10 near the first latch region 11, and the vertical width between the upper edge 10c and the bottom edge 10d of the separating plate 10 is progressively decreased toward the other side edge 10f. The other side edge 10f has a protrusion 19a protruding from the surface 10a on the opposite side of the engaging claws 18a and 18b. These members are integrally formed. A grooved guide rail portion 19 is formed in the inner surface of the protrusion 19a. One side end of the electronic component can be fitted in the guide rail portion 19 to support the electronic component.

A securing member to be fitted on the latch region of the separating plate 10 of FIGS. 1A to 3B will be explained with reference to FIGS. 4A to 4E. FIG. 4A is a perspective view of the securing member adapted to be mounted on the separating plate of FIGS. 1A to 1C, FIG. 4B is a perspective view of the securing member viewed from the opposite side of FIG. 4A, FIG. 4C is a side view thereof, FIG. 4D is a front view thereof, and FIG. 4E is a plan view thereof. The securing member 30 is formed of the same electrically insulating material as the separating plate 10 and includes a first elongated flat panel 31 and a second panel 32 in the same shape as the first panel 31 and coupled therewith by a coupling portion 35. The securing member 30 has an opening 37 on the opposite end of the coupling portion 35. The first panel 31 and the second panel 32 together define a narrow U-shape with a channel therein and they are in contact with each other at positions near the opening 37.

The securing member 30 further includes a latch protrusion or pawl 33 as a second latch member on the inner end surface of the first panel 31 near the opening 37 and a securing member 34 protruding outward from the end of the second panel 32 near the opening 37 and reinforced by a reinforcing portion 36. The inner surface of the second panel 32 is faced in the neighborhood of the opening 37 and forms an inclined portion 37a thereby to facilitate the fitting operation of the securing member 30 on the latch region of the separating plate 10.

Figure 4B:
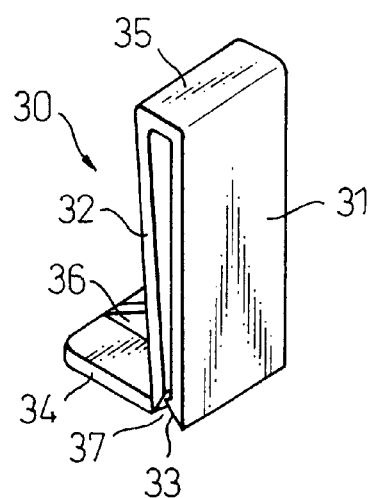
Figure 4C:
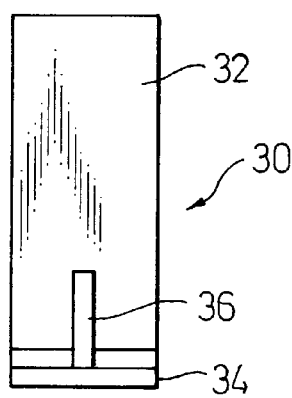
Figure 4D:
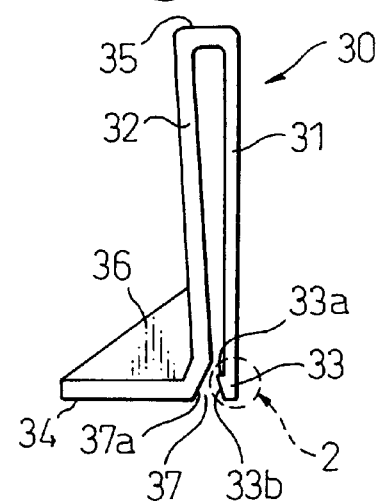
Figure 4E:
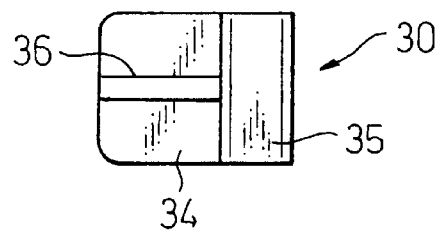

As shown in FIGS. 4A, 4B and 4D, the latch protrusion 33 includes a horizontal wall portion 33a extending substantially perpendicular to the inner surface of the first panel 31 and formed linearly and transversely and an inclined portion 33b inclined from the top of the horizontal portion 33a toward the lower end of the first panel 31. The latch protrusion 33 is adapted to engage with the latch groove 20 of the separating plate 10.

FIGS. 5A to 5D show the separating plate 10 of FIGS. 1A to 3B with the securing member 30 of FIGS. 4A to 4E mounted on the separating plate 10. FIG. 5A is a front view of the separating plate 10 of FIG. 1A with the securing member 30 of FIG. 4A, FIG. 5B is a plan view thereof, FIG. 5C is a side view, and FIG. 5D is a partly enlarged side view, showing in detail the latch structure with the latch members mutually engaged. The opening 37 of the securing member 30 is positioned on the first top 11a of the first latch region 11 of the separating plate 10, and the securing member 30 is then pushed, with the result that the securing member 30 slide on the securing member introducing portion 11b of the separating plate 10. The securing member 30 is further pushed, so the securing member 30 is fitted on the first latch region 11. When the insertion of the securing member 30 is stopped as shown in FIG. 5C, the latch protrusion 33 of the securing member 30 comes into engagement with one of the latch grooves 20 of the first latch region 11 formed on the surface 10b of the separating plate 10. Under this condition, an attempt to pull off the securing member 30 upward from the separating plate 10 would fail as the horizontal portion 33a of the latch protrusion 33 comes in contact with the horizontal portion 20a of the latch groove 20. On the other hand, when the securing member 30 is further pushed downward in the drawing, the inclined wall portion 33b of the latch protrusion 33 moves along the inclined wall portion 20b of the latch groove 20 and the latch protrusion 33 moves to the lower adjacent latch groove 20. This process is repeated so that the securing member 30 can be moved down in the first latch region 11. The securing member 30 can be further pushed, until the coupling portion 35 comes in contact with the top of the latch region, for example, this position is shown by the securing member 40 fitted on the fourth latch region 14.

In this way, the latch groove 20 of the separating plate 10 and the latch protrusion 33 of the securing member 30 make up a latch engagement, by which the securing member 30 is locked in the latch region of the separating plate 10. When the securing member 30 is to be removed from the separating plate, 10, the securing member 30 is slid along the continuous latch grooves 20 rightward in the longitudinal direction L in FIG. 5A to the non-latch region 15 and moved upward beyond the upper edge 10C at the separating plate 10. The securing member 40, on the other hand, can be pulled off upward after being slid leftward in the longitudinal direction L fully into the non-latch area 15.

Figure 7A:
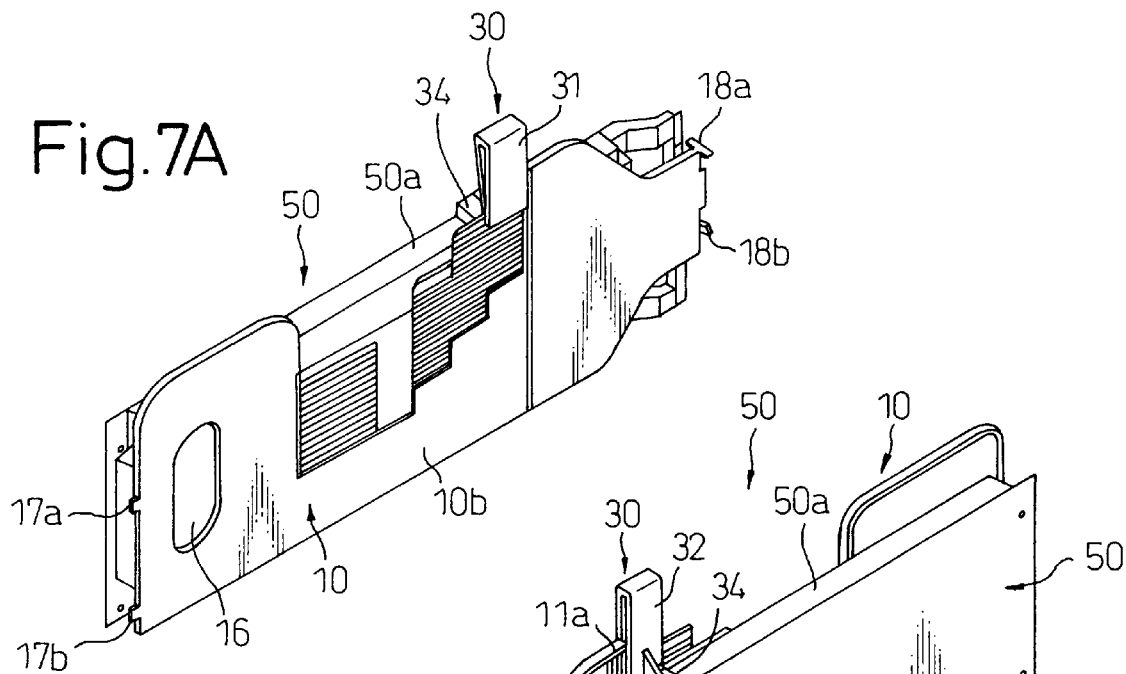
FIG. 7A is a perspective view of the separating structure of FIG. 6 viewed from the same side as FIG. 6.
Figure 7B:
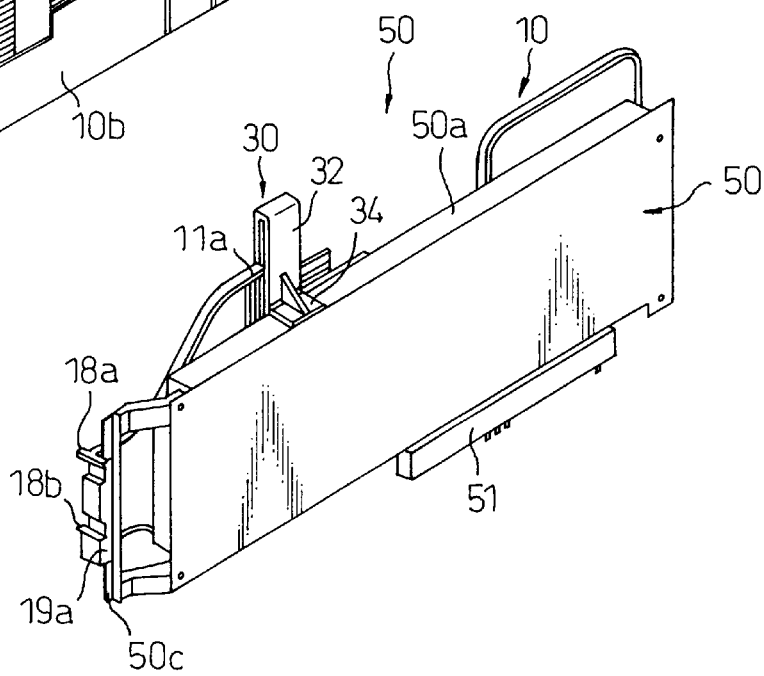
FIG. 7B is a perspective view of the separating structure viewed from the opposite, front side of FIG. 6.

Next, a separating structure of the electronic component arranged in proximity to the separating plate of FIGS. 1A to 3B and fixedly held by the securing member of FIGS. 4A to 4E will be explained with reference to FIGS. 6, 7A, 7B, 8A to 8D. FIG. 6 is a rear view of the separating structure of the electronic component arranged in proximity to the separating plate. FIG. 7A is a perspective view of the separating structure of FIG. 6 viewed from the same side as FIG. 6 and FIG. 7B is a perspective view thereof viewed from the opposite, front side of FIG. 6. FIG. 8A is a front view, FIG. 8B is a plan view, FIG. 8C is a left side view, and FIG. 8D is a right side view, of the separating structure of FIG. 6.

As shown in the drawings, a PCI card 50, as an example of the electronic component, has a terminal 50d (FIG. 8D) extending from the lower end 50b thereof, which terminal 50d is inserted into a connector 51 fixed on the housing (not shown) of the electronic apparatus. The separating plate 10 is arranged in proximity to a flat surface 52 of the PCI card 50, so that substantially the whole flat surface 52 of the PCI card 50 is covered with the separating plate 10. The separating plate 10 has the first and second latch regions 11 and 12 arranged higher than the upper edge 50a of the PCI card 50.

A side end 50c of the PCI card 50 is inserted into the guide rail portion 19 of the separating plate 10 (FIG. 8B) thereby to support the PCI card 50. In this way, the guide rail portion 19 is integrated with the separating plate 10 and, therefore, unlike in the prior art, a guide rail is not required as an independent member thereby desirably reducing the parts cost and the number of assembly steps. The separating plate 10 is fixed to the casing by means of engaging claws 17a, 17b, 18a and 18b.

Figure 13:
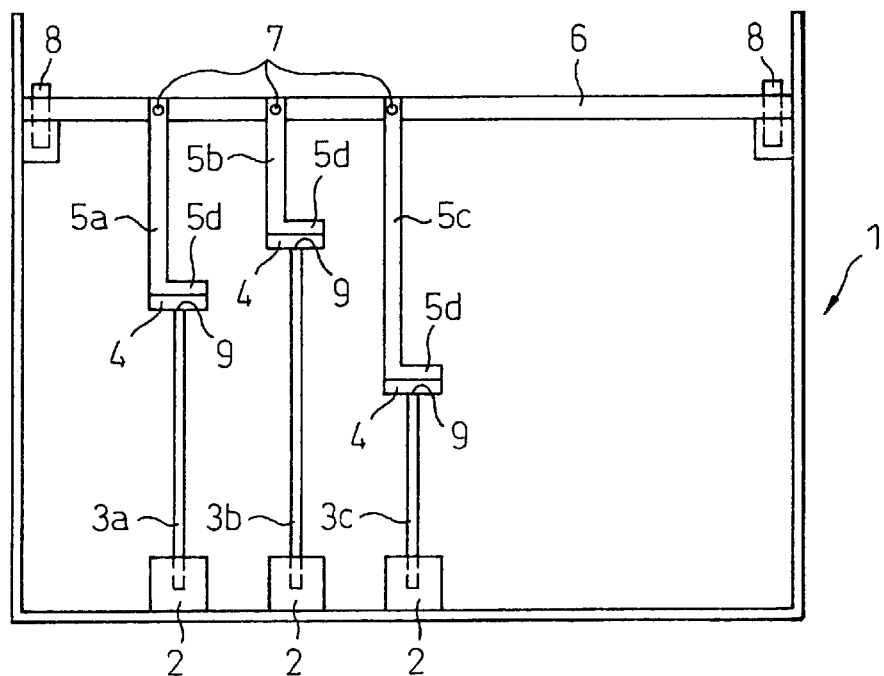
FIG. 13 is a diagram showing a securing structure for an electronic component of a conventional electronic apparatus.

The PCI card 50 thus arranged is easily and fixedly secured by the securing member 30 which is fitted on the first latch region 11 of the separating plate 10 and the securing portion 34 comes into contact with the upper edge 50a of the PCI card 50. As a result, the separating structure according to the embodiment of the present invention is simplified and the electronic components are held and fixed very easily compared with the conventional securing structure of FIG. 13. Thus, the number of the assembly steps of the electronic apparatus is reduced thereby leading to a very advantageous cost. Also, as explained with reference to FIGS. 5A to 5D, the latch protrusion 33 of the securing member 30 is engaged with the latch groove 20 of the first latch region 11 on the surface 10b of the separating plate 10 thereby to form a latch structure. Therefore, the securing member 30 cannot move up, thereby making it possible to secure and fix the PCI card 50 positively and to prevent the loosened condition in which the PCI 50 could come off from the connector 51.

Figure 9A:
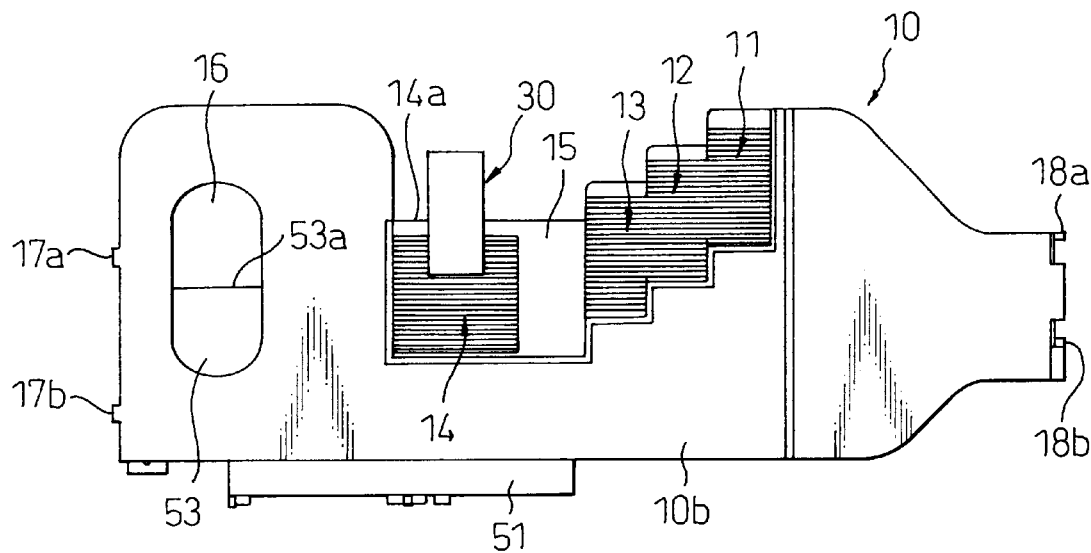
Figure 9B:
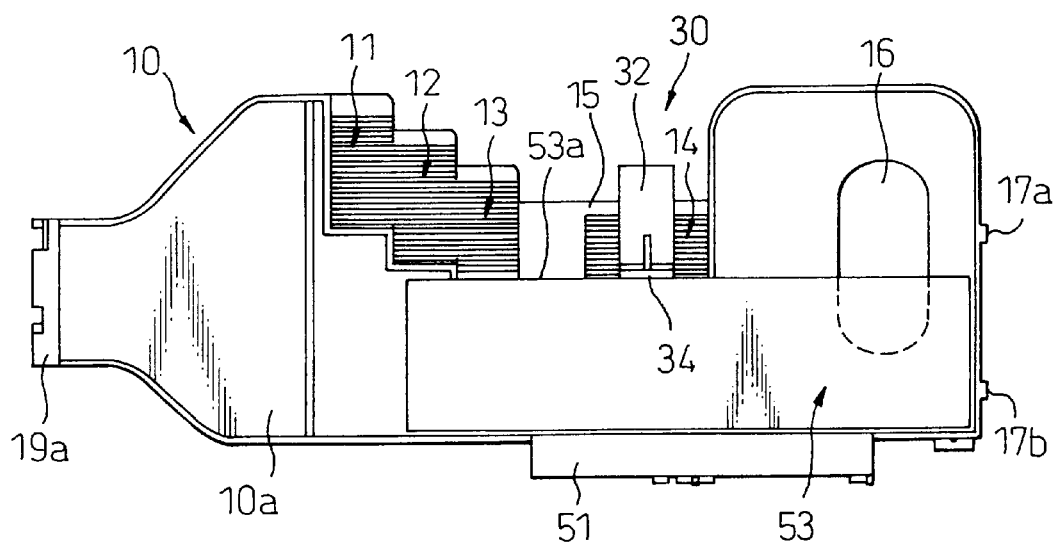

Now, a modification in which a PCI card lower in height than the PCI card described above will be explained with reference to FIGS. 9A and 9B. FIG. 9A is a rear view, and FIG. 9B is a front view, of a separating structure of an electronic component comparatively low in height. The PCI card 53 is lower than the top 14a of the fourth latch region 14 and is secured and fixed by the securing portion 34 of the securing member 30 which comes into contact with the upper edge 53a of the PCI card 53. The upper edge 53a of the PCI card 53 is located at a level in the opening 16. Therefore, the PCI card 53, when pulled out of or inserted into the connector 51, can be grasped through the opening 16. The electronic components of various sizes of different heights can thus be secured and fixed positively by means of the same securing member in a plurality of latch regions of different heights corresponding to the different sizes of the electronic components. Also, the fact that the electronic component can be grasped through the opening facilitates the mounting and demounting of the electronic component and simplifies the work of changing the electronic components which are especially low in height. Further, the securing members 30 of the same size can be used in various latch regions, and therefore the number of parts is not increased unnecessarily, resulting in a lower cost.

Figure 10C:
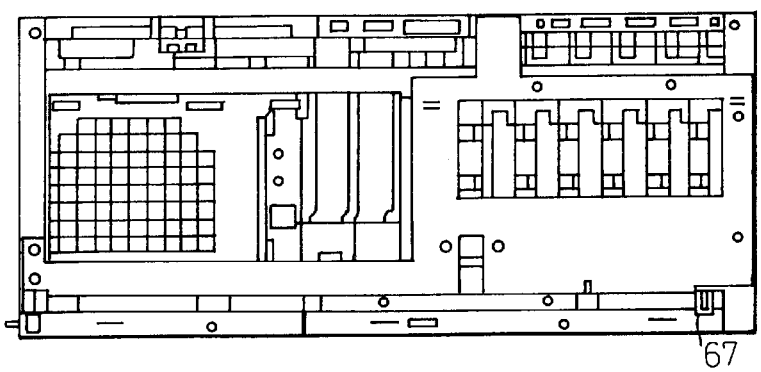
Figure 10A:
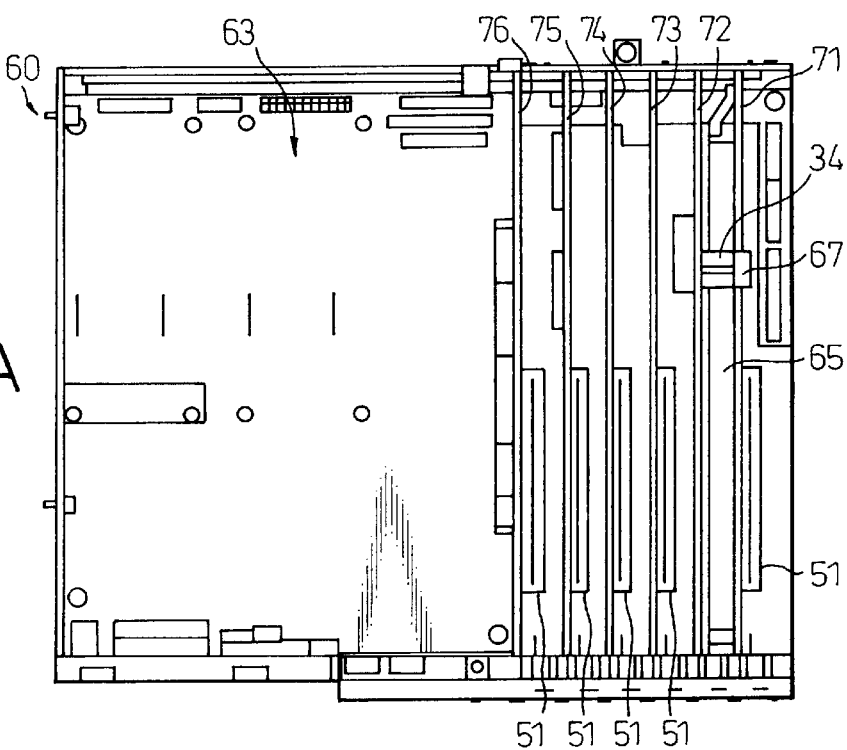
Figure 10B:
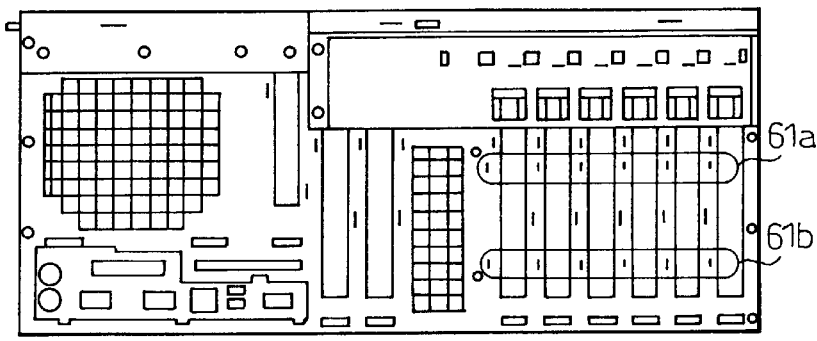
Figure 11A:
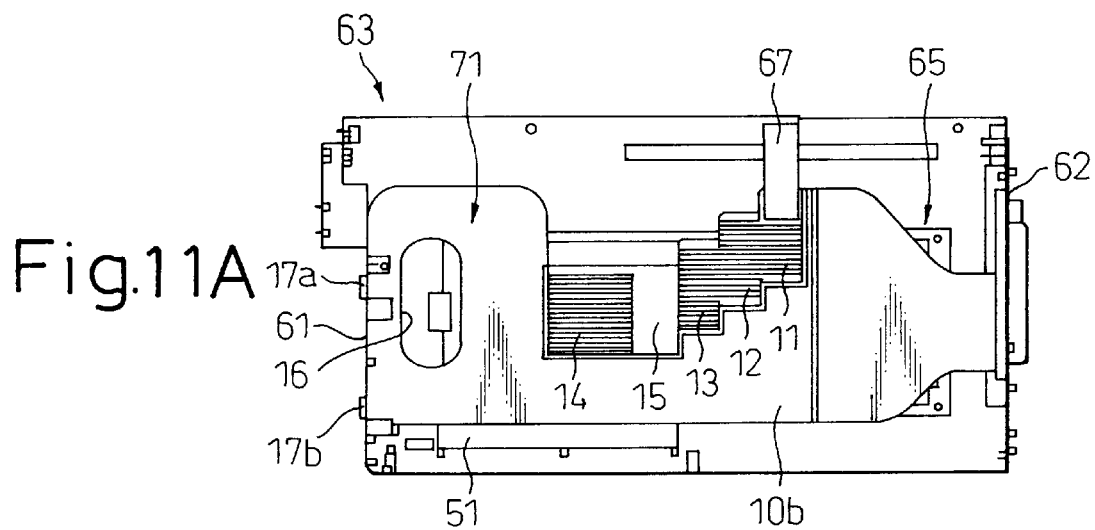
FIG. 11A is a side view of the casing of the electronic apparatus of FIG. 10A.
Figure 11B:
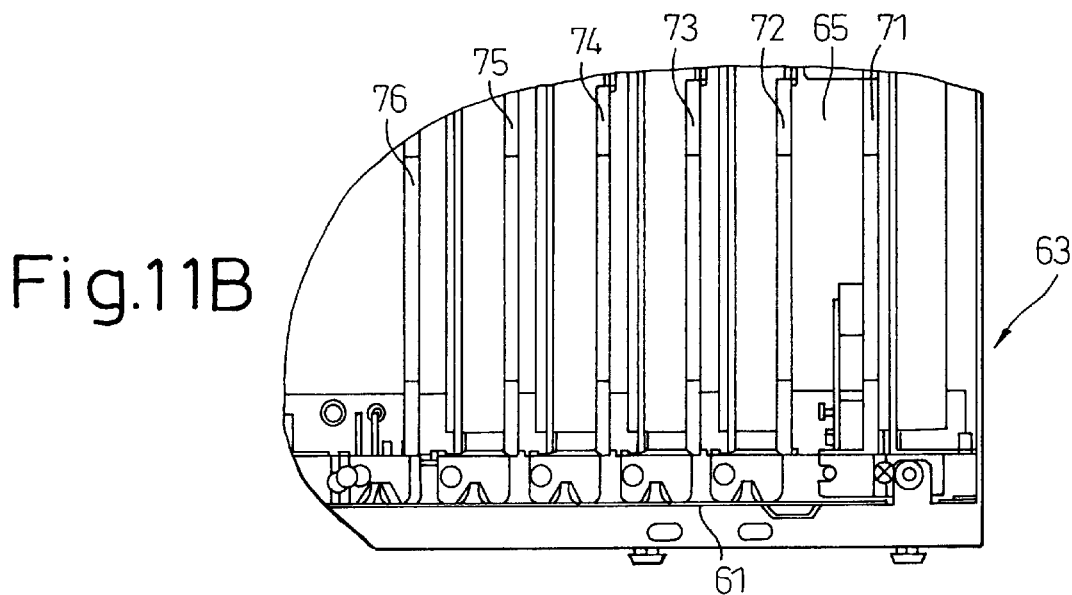
FIG. 11B is a partly enlarged plan view of the casing near the front panel thereof.
Figure 11C:
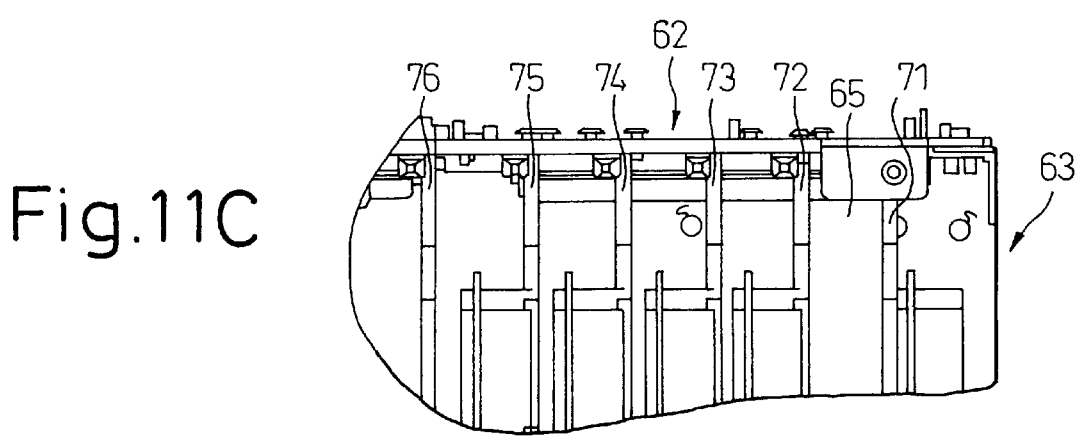
FIG. 11C is a partly enlarged plan view of the casing near the rear panel thereof.
Figure 12:
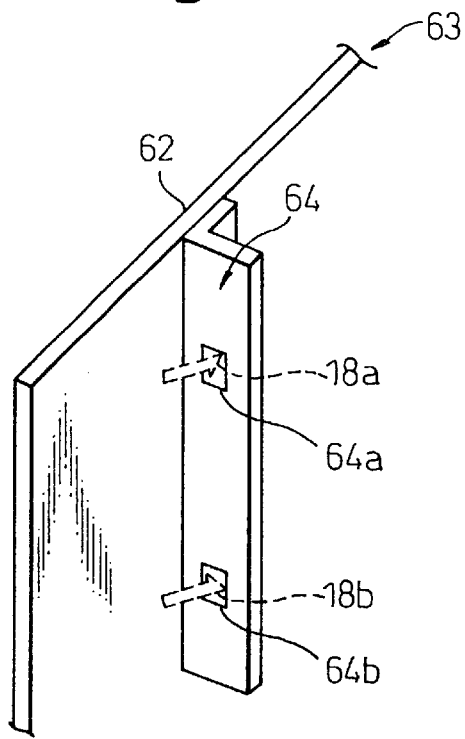
FIG. 12 is a perspective view showing the engaging holes formed in the rear panel of the casing in FIG. 10C.

Next, an example in which the separating structure for the electronic component described above is applied to an electronic apparatus will be explained with reference to FIGS. 10A to 10C, 11A to 11C and 12. FIG. 10A is a plan view, FIG. 11B is a front view, and FIG. 11C is a rear view, of the casing of the electronic apparatus to which the separating structure shown in FIGS. 6 to 8D is applied. FIG. 11A is a side view of the casing of FIG. 10A, FIG. 11B is a partly enlarged plan view of the neighborhood of the front panel of the housing, and FIG. 11C is a partly enlarged plan view of the neighborhood of the rear panel of the housing. FIG. 12 is a perspective view showing engaging holes formed in the rear panel of the housing shown in FIGS. 10A to 10C. As shown, an electronic apparatus has a casing 63 fixed therein, and separating plates 71 to 76 similar to the separating plate 10 in FIGS. 1A to 3B, the I/O card sockets 51 and the I/O card 65 are arranged in the casing 63. The I/O card 65 is fitted in the socket 51 (FIG. 11A) and arranged between the separating plates 71 and 72. In the same manner as described above, the securing member 67 is fitted on the first latch region 11 of the separating plate 71, and the I/O card 65 is fixedly secured by the securing portion 34 of the securing member 67.

The I/O card sockets 51 are arranged between the separating plates 72 and 73, between the separating plates 73 and 74, between the separating plates 74 and 75, and between the separating plates 75 and 76. As a result; an I/O card such as a PCI card can arbitrarily be added as desired by the user while the electronic apparatus 60 is in use.

In order to arrange the separating plate 71 in the casing 63, a pair of engaging holes 61a and 61b are formed in the front panel 61 of the housing 63 as an engaging means of the housing, and a pair of engaging holes 64a and 64b constituting an engaging means of the casing are formed in an engaging member 64 erected on the inner surface of the rear panel 62, as shown in FIG. 12. The separating plate 71, when arranged in the casing 63, is slightly displaced while inserting the engaging claws 17a and 17b of the separating plate 71 into the engaging holes 61a and 61b of the front panel 61. At the same time, the engaging claws 18a and 18b on the opposite side, while being elastically deformed away from each other, are pushed into the engaging holes 64a and 64b of the rear panel 62. Thus, the engaging claws 18a and 18b engage with the engaging holes 64a and 64b. The other separating plates 72 to 76 can also be arranged in the casing 63 in a similar fashion. In this way, the separating plates 71 to 76 can be mounted to the casing 63 without using any special parts such as screws, unlike the prior art. Thus, an accident such as the screws being inadvertently dropped on other substrates can be prevented at the time of the maintenance work, and the maintenance work can be conducted with the power for the electronic apparatus 60 kept on.

The I/O card constituting an electronic component can be connected to a socket between the separating plates 72 and 73, for example, and like the I/O card 65, can be mounted to the casing and fixedly secured by the securing member. When the I/O card is removed for replacement at the time of maintenance work or mounted at the time of addition, any interference with other I/O cards by touching, for example, can be prevented, and the maintenance work can be conducted advantageously with the power kept on for the electronic apparatus.

Also, when removing the I/O card 65, it can be easily pulled off upward, by sliding the securing member 67 leftward in FIG. 11A to the non-latch region 15 and pulling it up. In this way, the latch engagement can be released easily, and therefore the time required for the maintenance work such as the change of parts can be shortened. Also, unnecessary vibrations or shocks are not generated during the assembly work, and no adverse effect is had on the other precision parts such as the hard disk of the electronic apparatus 60.

Also, the separating plates 71 to 76 can exhibit the function as means for regulating the air from the cooling fan (not shown) provided in the electronic apparatus 60 for cooling the internal heat-generating parts and heat-insulating the various parts.

Figure 14A:
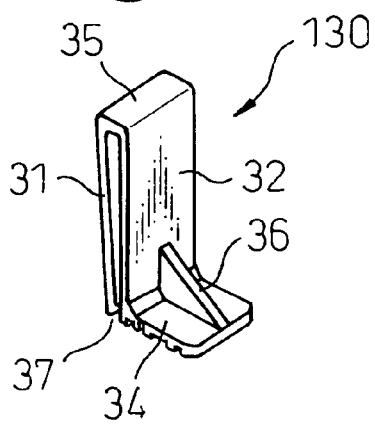
Figure 14B:
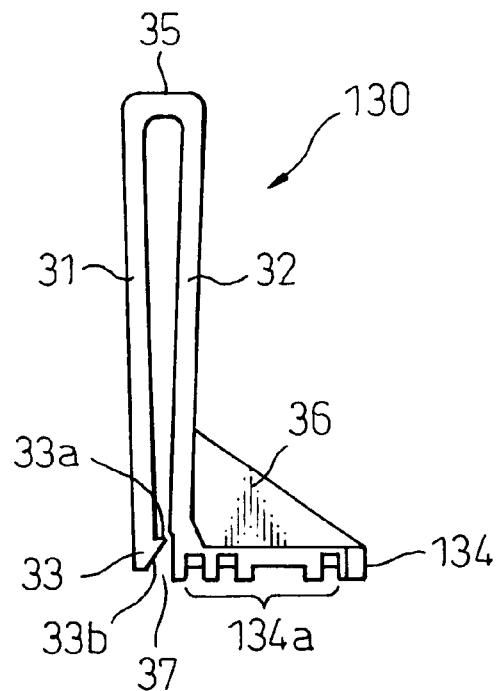
Figure 14C:
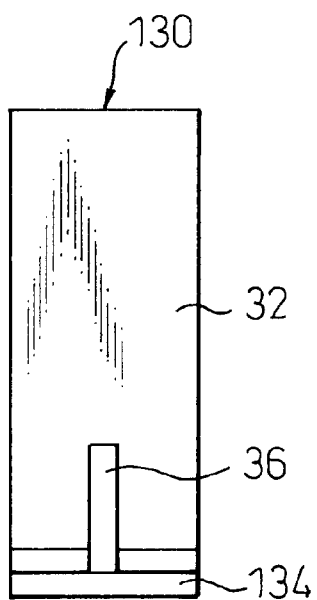
Figure 14D:
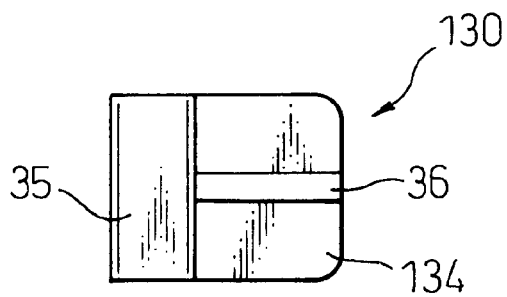

Now, a modification of the securing member shown in FIG. 4 will be explained with reference to FIG. 14A to 14D. FIG. 14A is a perspective view, FIG. 14B is a front view, FIG. 14C is a side view, and FIG. 14D is a plan view, of the securing member. The securing member 130 has the same basic configuration as the securing member 30 of FIGS. 4A to 4D except for the configuration of the securing portion, and therefore the same component parts designated by the same reference numerals, respectively, are not explained again.

As shown, a groove portion 134a having a plurality of grooves is formed in the securing portion 134 of the securing member 130. The groove portion 134a is formed at a position and in a shape corresponding to the position and the shape of the upper edge of the electronic component such as the PCI card or the I/O card to be secured. The upper edge of the PCI card or the like is fitted and held in the groove portion 134a thereby to secure and fix the electronic component such as the PCI card more positively. Also, not only the longitudinal vibration but also the transverse vibration exerted on the electronic component can be effectively prevented, thereby making it possible to prevent a loosened condition of the electronic component more positively.

Figure 16:
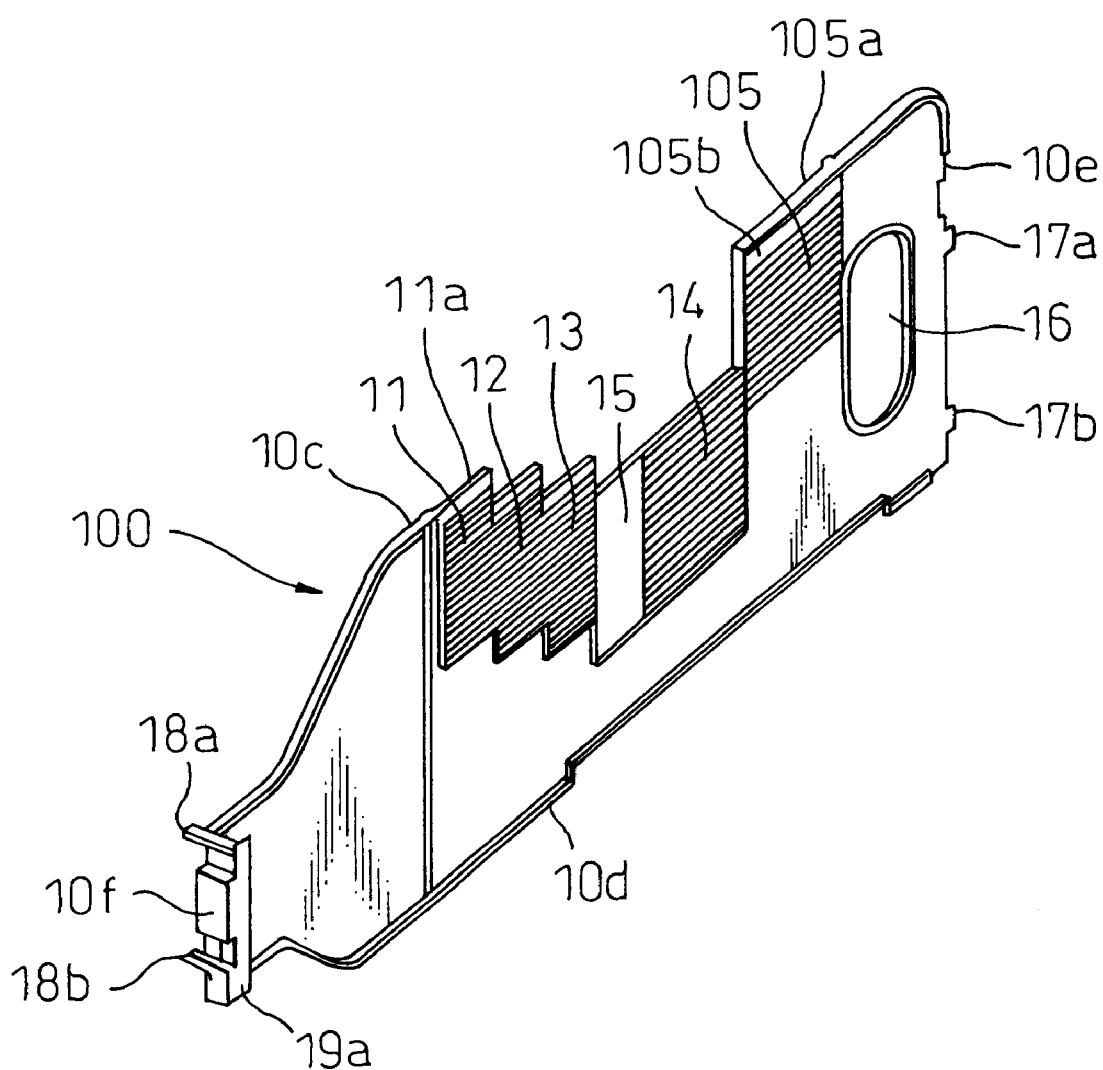
FIG. 16 is a perspective view of the separating plate shown in FIGS. 15A and 15B.

A modification of the separating plate shown in FIGS. 1A to 3B will be explained with reference to FIGS. 15A to 16. FIG. 15A is a front view, and FIG. 1B is a plan view, of the separating plate, and FIG. 16 is a perspective view of the separating plate. The separating plate 100 has the same basic configuration as the separating plate shown in FIGS. 1A to 3B except that a fifth latch region is added to the separating plate shown in FIGS. 1A to 3B, and therefore will not be described again, with the same component parts designated by the same reference numerals, respectively.

As shown, the separating plate 100 has a fifth latch region 105 between the opening 16 and the fourth latch region 14. The fifth latch region 105 is formed to a predetermined height and a longitudinal width through a securing member introducing portion 105b having no latch member, and the top 105a of the fifth latch region 105 is substantially the same height as the top 11a of the first latch region 11.

The separating plate 100 can be used, for example, by fitting the securing member 30 on the fifth latch region 105, in the case where the electronic compound cannot be secured at the first latch area 11, depending on the length of the electronic component such as the PCI card or the I/O card to be secured or the position of the connecting socket for the PCT card or the like. In this way, the provision of the fifth latch region 105 desirably makes it possible to meet the requirement for using the electronic components such as the PCI card and the I/O card of various types and sizes in versatile way. Also, the same electronic component can be held at two points including the first and fifth latch regions 11 and 105, and thereby the electronic component can be fixed more positively.

FIG. 17A is a front view, FIG. 17B is a plan view, and FIG. 17C is a side view, of the separating plate 100 of FIG. 16 on which the securing member of FIGS. 14A to 14D is mounted. As shown, a latch structure is formed in engaged fashion with a plurality of the securing members 131, 132 and 133 of 14A to 14D fitted on the first latch region 11, the fourth latch region 14 and the fifth latch region 105, respectively.

Next, a partitioning structure in which an electronic component arranged in proximity to the separating plate 100 of FIGS. 15A to 16 is fixedly secured by the securing member 130 of FIGS. 14A to 14D will be explained with reference to FIGS. 18A to 19B. FIG. 18A is a rear view, FIG. 19B is a plan view, FIG. 19C is a left side view, FIG. 19D is a right side view, FIG. 19E is a front view, and FIG. 19F is a partly enlarged right side view, of a partitioning structure in which an electronic component is arranged in proximity to the separating plate of FIGS. 15A to 16 and fixedly secured by the securing member of FIGS. 14A to 14D. FIG. 19A is a perspective view of the separating structure viewed from the same side as FIG. 18A and FIG. 19B is a perspective view of the same separating structure taken from the opposite, front side of FIG. 18A.

As shown in the drawings, a PCI card 150 having a plurality of parts mounted thereto and a comparatively large thickness as a whole is arranged in proximity to the surface 10a of the separating plate 100 and fixedly secured by the securing member 130 of FIGS. 14A to 14D in the first latch region of the separating plate 100. With this separating structure, as shown in FIG. 18F, the upper edge 150b of the printed circuit board 150a of the PCI card 150 is fitted and held in the groove of the groove portion 134a of the securing portion 134, and therefore the PCI card 150 is fixedly secured more positively by the securing member 130. Also, the longitudinal and transverse vibrations which otherwise might be exerted on the PCI card 150 can be effectively prevented, thereby making it possible to prevent the loosened condition of the PCI card 150 more positively. Further, the PCI card 150 can be secured at two positions using another securing member 130 for securing the upper edge portion of the PCI card 150 in another latch region (the fifth latch region 105, for example). Thus, the electronic component can be fixed even more positively.

Figure 20F:
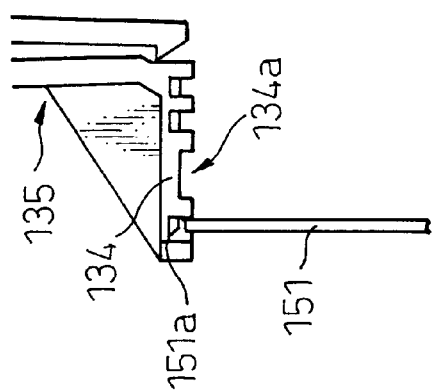
Figure 20E:
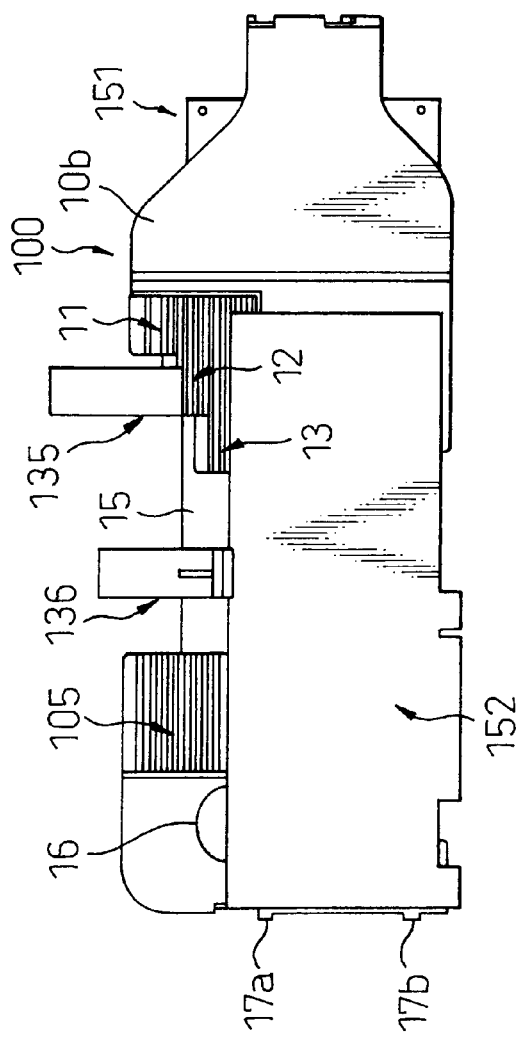
Figure 21A:
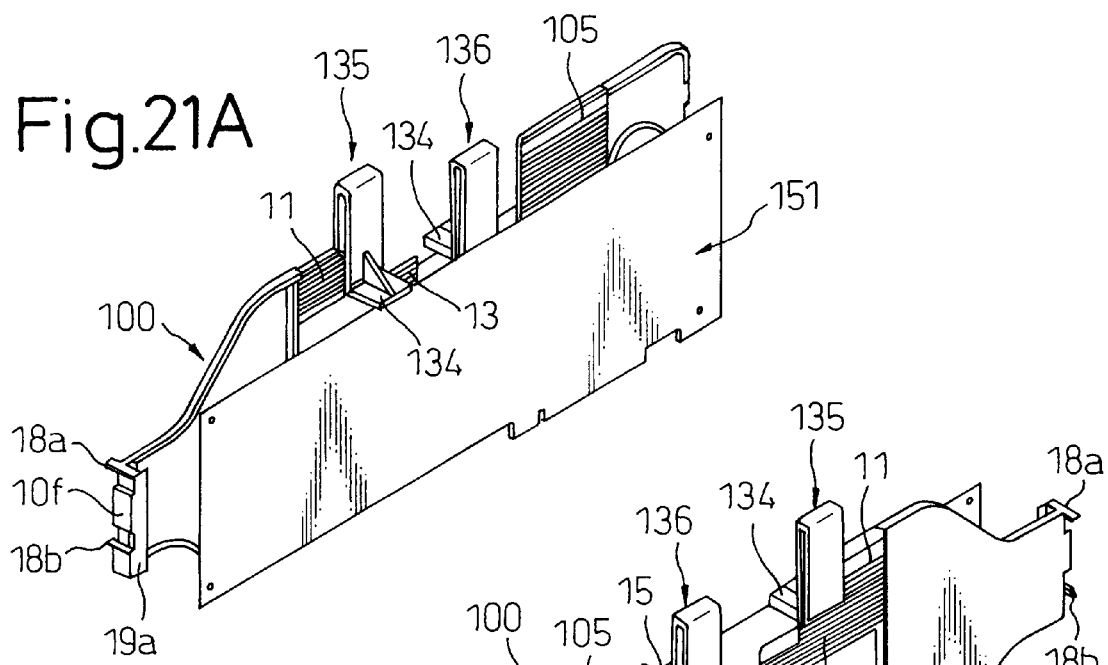
FIG. 21A is a perspective view of the separating structure of FIGS. 20A to 20F viewed from the same side as FIG. 20A.
Figure 21B:
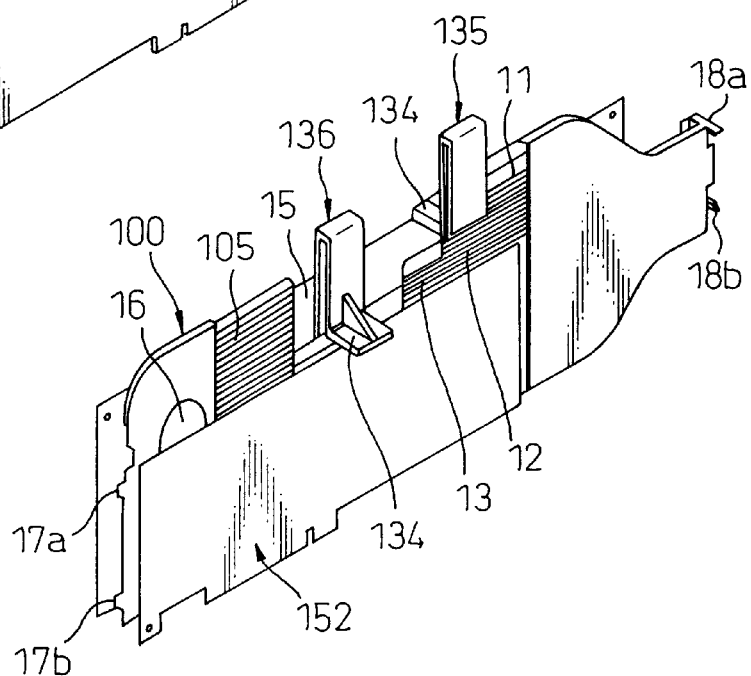
FIG. 21B is a perspective view of the separating structure viewed from the opposite, front side of FIGS. 20A.

An explanation will now be given of a case in which another PCI card is arranged on the other surface of the separating plate and the separating plate is arranged between two PCI cards, with reference to FIGS. 20A to 21B. FIG. 20A is a rear view, FIG. 20B is a plan view, FIG. 20C is a left side view, FIG. 20D is a right side view, FIG. 20E is a front view, and FIG. 20E is a partly enlarged right side view, of a partitioning structure of two electronic components with the separating plate of FIGS. 15A to 16 arranged between and in proximity to each other, which are fixedly secured by the securing member of FIGS. 14A to 14D. FIG. 21A is a perspective view of the same separating structure taken from the same side as FIG. 20A and FIG. 21B is a perspective view taken from the opposite front side.

As shown in the drawings, the tabular PCI card 151 is arranged on the side of the surface 10a of the separating plate 100 and the tabular PCI card 152 comparatively small in both height and length is arranged on the side of the surface 10b of the partitioning plate. The separating plate 100 separates two PCI cards 151 and 152 in such a manner as to electrically insulate them from each other. The securing member 134 shown in FIGS. 14A to 14D fixedly secures the PCI card 151 in the second latch region 12 of the separating plate 100, and in a similar fashion, the securing member 135 fixedly secures the PCI card 151 in the fourth latch region 14 of the separating plate 100. The PCI cards 151 and 152, as shown in FIGS. 20C, 20D and 20F, having the upper edge 151a and 152a thereof fitted in the groove portion 134a of the securing portion 134, are more positively and fixedly secured.

Although an example, in FIGS. 6 to 8, 9, 18 and 19, is explained in which a single PCI card constituting an electronic component is arranged with a separating plate, the separating plate 100 in FIGS. 20 and 21 can separate two PCI cards 151 and 152 in electrically insulated fashion, where are free of interference at the time of assembly and removal. Therefore, the assembly and maintenance work are facilitated for an improved workability and safety. Also, even PCI cards of different heights like the PCI cards 151 and 152 can be fixedly secured by fitting the securing members on different latch regions.

Figure 22A:
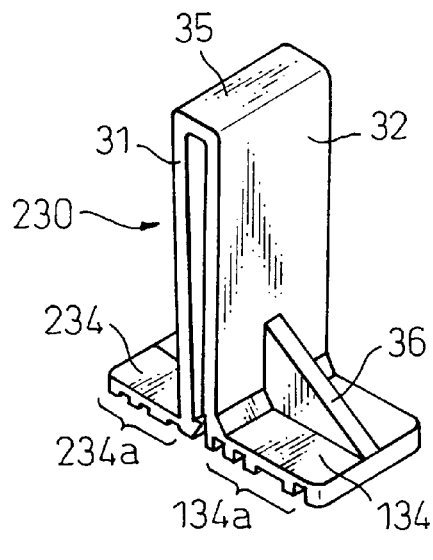
Figure 22B:
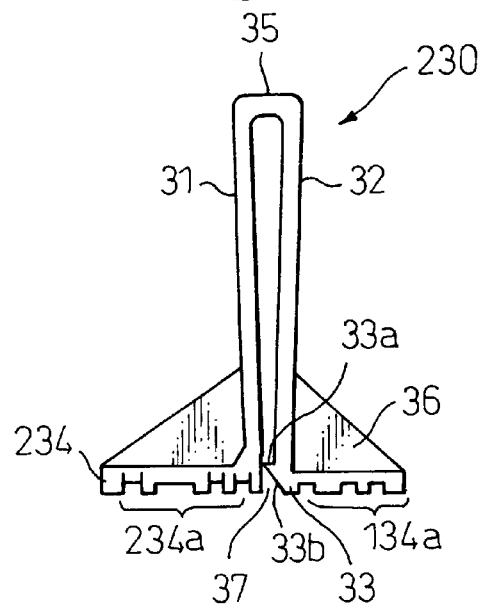
Figure 22C:
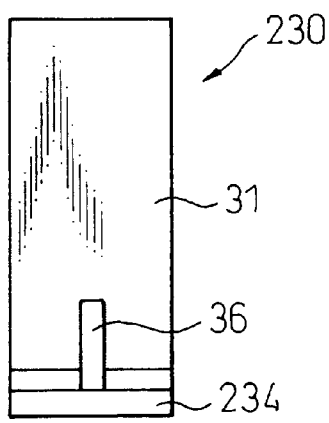
Figure 22D:
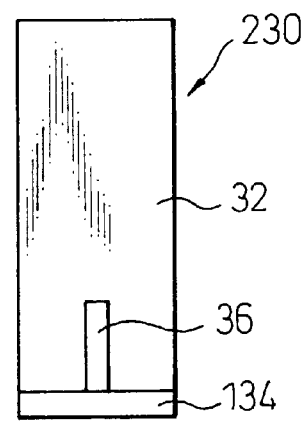
Figure 22E:
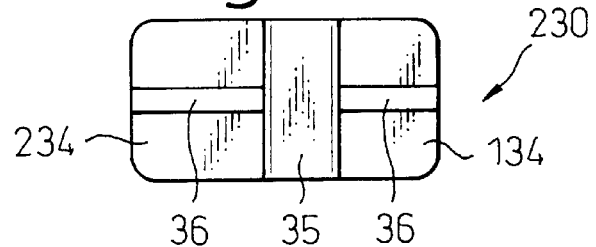

A modification of the securing member of FIGS. 14A to 14D will be explained with reference to FIGS. 22A to 22E. FIG. 22A is a perspective view, FIG. 22B is a front view, FIG. 20C is a left side view, FIG. 22D is a right side view, and FIG. 22E is a plan view, of the securing member. This securing member 230 has the same basic configuration as the securing member 130 of FIGS. 14A to 14D except for the configuration the securing portion. Therefore, the same component parts are designated by the same reference numerals, respectively, and will not be explained.

As shown in the drawings, the securing member 230 further includes a securing portion 234 arranged on the outside of the lower end of the first panel 31 and reinforced by a reinforcing portion 36. This securing portion 234 is formed with a groove portion 234a having a plurality of grooves like the securing portion 134. By the way, the latch protrusion 33 is formed on the inner surface of the end portion of the second panel 32. With this securing member 230, two PCI cards can be fixedly held by two securing portions 134 and 234 of a single securing member on the two sides of the separating plate. If the height of the two PCI cards is the same, only one securing member is advantageously used.

Figure 23D:
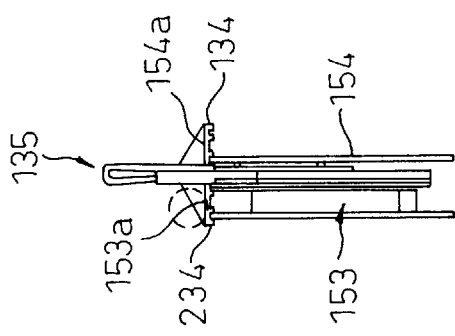
Figure 23B:
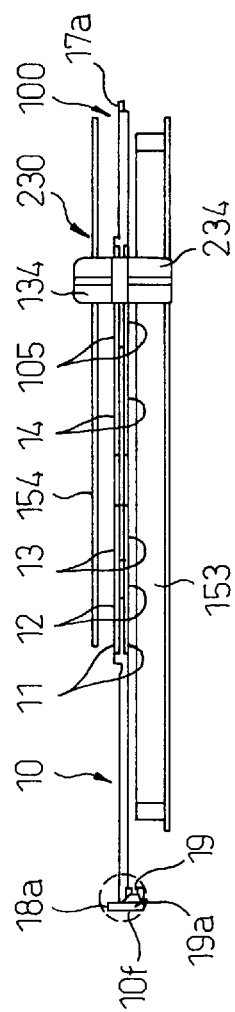
Figure 23A:
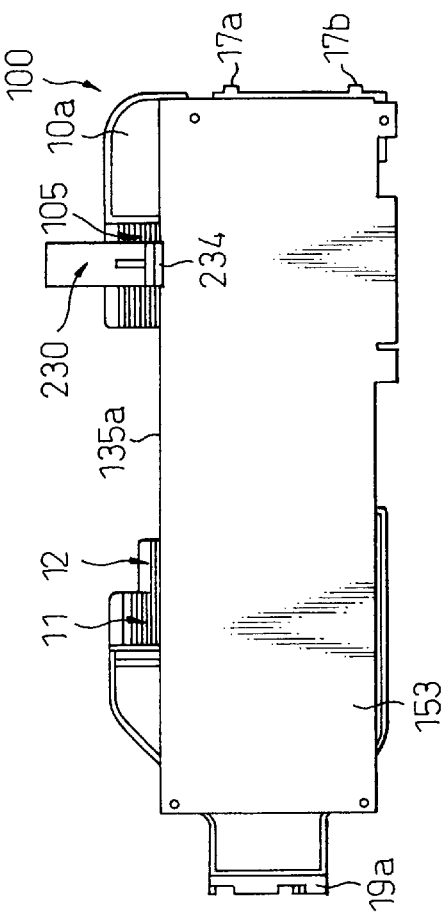
Figure 23C:
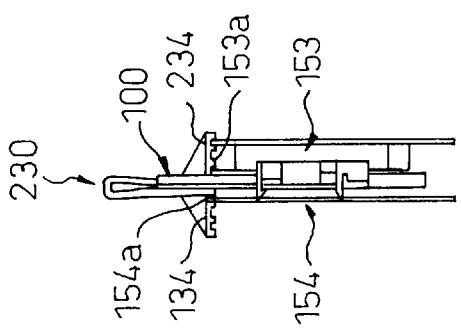
Figure 23E:
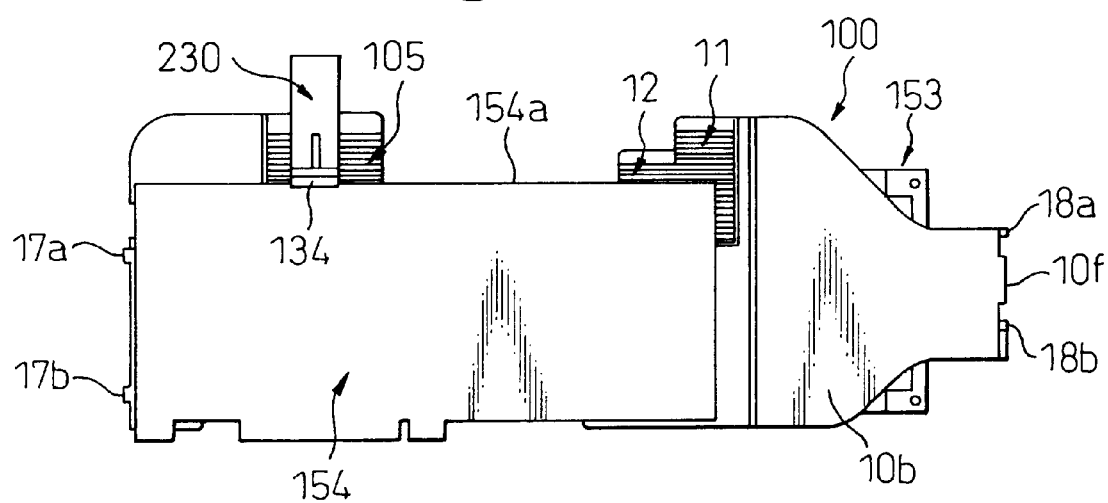
Figure 24A:
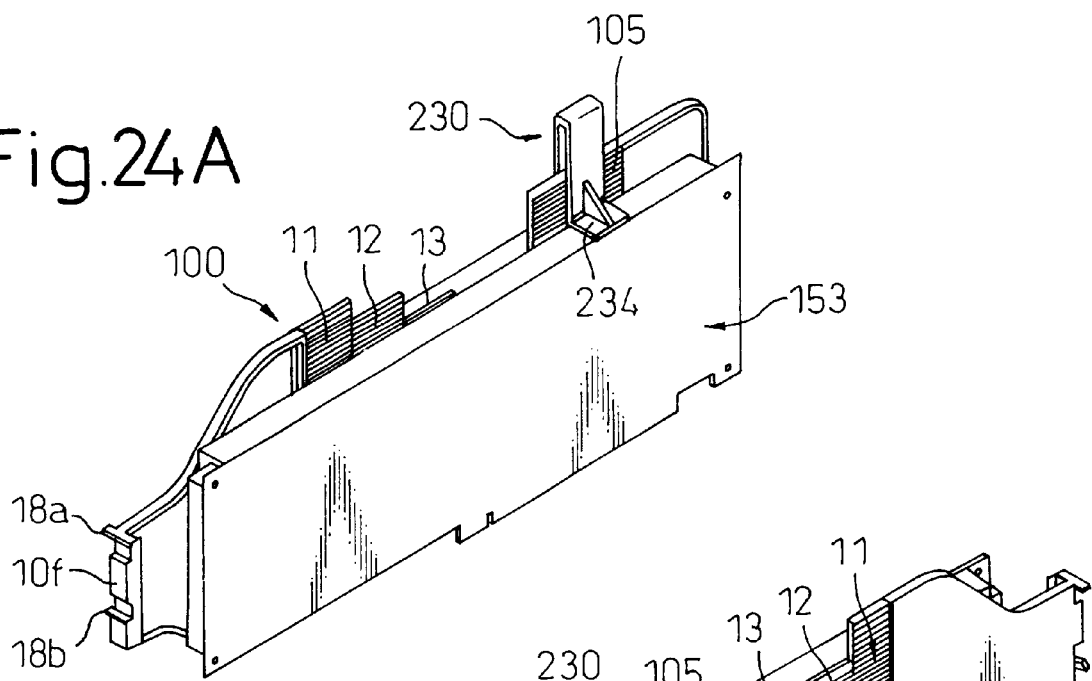
FIG. 24A is a perspective view of the separating structure of FIGS. 23A to 23E viewed from the same side as FIG. 23A.
Figure 24B:
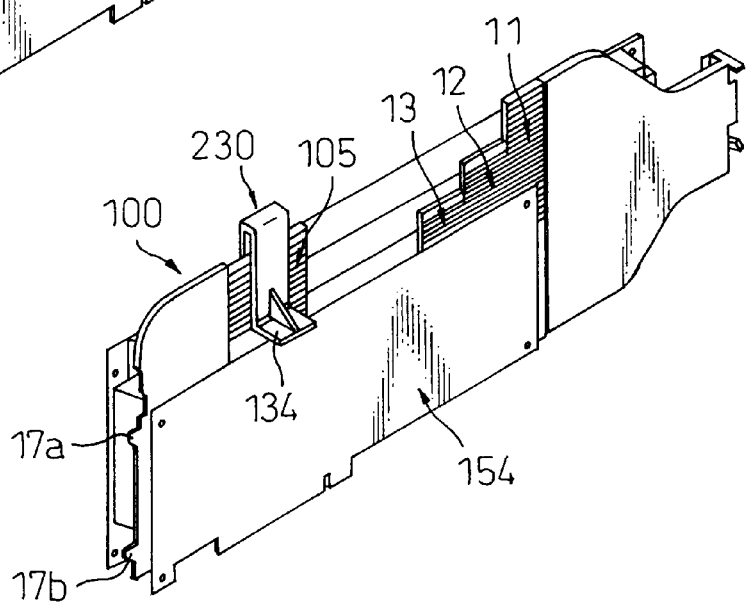
FIG. 24B is a perspective view, of the separating structure, viewed from the opposite, front side of FIG. 23A.

Next, with reference to FIGS. 23A to 24B, an explanation will be given of a separating structure for electronic components in which two electronic components arranged separately in proximity to the separating plate 100 shown in FIGS. 15A to 16 are fixedly secured by the securing member 230 of FIGS. 22A to 22E. FIG. 23A is a rear view, FIG. 23B is a plan view, FIG. 23C is a left side view, FIG. 23D is a right side view, and FIG. 23E is a front view, of a separating structure for electronic components arranged in proximity to the separating plate of FIGS. 15A to 16 and fixedly secured by the securing member of FIGS. 22A to 22E. FIG. 24A is a perspective view of the separating structure viewed from the same side as FIG. 23A and FIG. 24B is a perspective view of the structure viewed from the opposite, front side of FIG. 23A.

As shown in the drawings, the comparatively thick PCI card 153 constituting an electronic component is arranged in proximity to the surface 10a of the separating plate 100, and the tabular PCI card 154 of the same height as the PCI card 153 is arranged in proximity to the surface 10b of the separating plate 100. The two PCI cards 153 and 154 are fixedly secured by the securing portions 134 and 234, respectively, of the securing member 230 of FIGS. 22A to 22E in the fifth latch regions 105 of the separating plate 100. With this separating structure, the upper edges 153a and 154a of the PCI cards 153 and 154 are fitted in the grooves of the groove portions 134a and 234a of the securing portions 134 and 234, respectively. As a result, the two PCI cards 153 and 154 are more positively secured and fixed by a single securing member 230. Also, the longitudinal vibrations and the transverse vibrations which otherwise might be exerted on the PCI cards 153 and 154 can be effectively prevented, thereby making it possible to prevent the loosened condition of the PCI cards 153, 154 more positively.

The present invention is explained above with reference to the preferred embodiments, but the present invention is not limited to these embodiments, and it is possible to conceive various modifications within the scope of the technical concept and of the present invention. For example, the separating plate may be configured as a vertically long part instead of a horizontally long part according to the shape and structure of the electronic apparatus. Also, a plurality of openings may be formed with an increased or a decreased number of latch regions. Further, the guide rail portion may be arranged not only on the side end 10f but also on the other side end 10e. Furthermore, the second latch portion of the securing member may be grooved so that the grooved second latch portion and the protruding first latch portion of the separating plate may constitute a latch structure.

As explained in greater detail, according to the present invention, there is provided a separating plate, a securing member, a separating structure for an electronic component and an electronic apparatus in which an electronic component is electrically insulated from an adjacent electronic component and can be fixedly secured positively on the one hand and the workability and the safety can be improved at the time of changing or adding an electronic component on the other part.

Also, there is provided a separating plate, a securing member, a separating structure for an electronic component and an electronic apparatus in which the electronic component, even if changed in size, can be fixedly secured positively and can be easily mounted or demounted.

Further, there is provided a separating plate, a securing member, a securing structure for an electronic component and an electronic apparatus of a simple structure in which the parts cost and the number of assembly steps can be reduced.

What is claimed is:

1. A separating plate comprising a plate member made of an electrically insulating material, said plate member having opposite surfaces and at least one latch region having a first latch member formed in at least one of the opposite surfaces, said plate member being constructed such that a securing member having a second latch member can be fitted on said latch region and said second latch member can engage with said first latch member to secure an electronic component arranged such that said plate member opposite surfaces, having at least one latch region, are in a parallel relationship with faces of said electronic component.

2. A separating plate according to claim 1, wherein said first latch member comprises a plurality of latch grooves, said second latch member comprising a pawl engageable with said latch grooves.

3. A separating plate according to claim 2, wherein said plate member has an upper edge and said latch region has a top corresponding to said upper edge, said latch grooves being arranged below said top so that said securing member can be fitted on said latch region in a first direction from said top toward said latch grooves, said latch grooves being configured such that said pawl can be moved beyond some of said latch grooves in said first direction but cannot be moved beyond said latch grooves in a second direction opposite to said first direction, and can slide along one of said latch groove for removal of said securing member from said plate member.

4. A separating plate comprising a plate member made of an electrically insulating material, said plate member having opposite surfaces and at least one latch region having a first latch member formed in at least one of the opposite surfaces, said plate member being constructed such that a securing member having a second latch member can be fitted on said latch region and said second latch member can engage with said first latch member to secure an electronic component arranged in proximity to said plate member, wherein said first latch member comprises a plurality of latch grooves, said second latch member comprising a pawl engageable with said latch grooves, said plate member has an upper edge and said latch region has a top corresponding to said upper edge, said latch grooves being arranged below said top so that said securing member can be fitted on said latch region in a first direction from said top toward said latch grooves, said latch grooves being configured such that said pawl can be moved beyond some of said latch grooves in said first direction but cannot be moved beyond said latch grooves in a second direction opposite to said first direction, and can slide along one of said latch grooves for removal of said securing member from said plate member, and said at least one latch region comprises a plurality of latch regions, each of said latch regions having said top and said plurality of latch grooves, said top of one latch region and said top of the adjacent latch region being formed at different heights so as to form a step.

5. A separating plate according to claim 4, wherein a part of said latch grooves of one latch region are continuous to a part of said latch grooves of the adjacent latch region.

6. A separating plate according to claim 4, wherein two latch regions are arranged at a distance between them and a non-latch region is arranged between said two latch regions so that said securing member can slide along one of said latch grooves of said two latch regions and can be removed at said non-latch region.

7. A separating plate comprising a plate member made of an electrically insulating material, said plate member having opposite surfaces and at least one latch region having a first latch member formed in at least one of the opposite surfaces, said plate member being constructed such that a securing member having a second latch member can be fitted on said latch region and said second latch member can engage with said first latch member to secure an electronic component arranged in proximity to said plate member, wherein said plate member further has a guide rail portion integrally formed therewith for guiding said electronic component arranged in proximity to said plate member.

8. A separating plate comprising a plate member made of an electrically insulating material, said plate member having opposite surfaces and at least one latch region having a first latch member formed in at least one of the opposite surfaces, said plate member being constructed such that a securing member having a second latch member can be fitted on said latch region and said second latch member can engage with said first latch member to secure an electronic component arranged in proximity to said plate member, wherein said plate member further has an opening through which said electronic component arranged in proximity to said plate member can be grasped.

9. A separating plate comprising a plate member made of an electrically insulating material, said plate member having opposite surfaces and at least one latch region having a first latch member formed in at least one of the opposite surfaces, said plate member being constructed such that a securing member having a second latch member can be fitted on said latch region and said second latch member can engage with said first latch member to secure an electronic component arranged in proximity to said plate member, wherein at least one latch region is arranged in one of said opposite surfaces, and at least one further latch region is arranged in the other of said opposite surfaces.

10. A separating plate according to claim 1, wherein said plate member further has claws to fix said separating plate to a casing of an electronic apparatus in which said separating plate is to be arranged.

11. A separating structure comprising a separating plate, a securing member, and two electronic components arranged in proximity to said separating plate on either side thereof;

said separating plate comprising a plate member made of an electrically insulating material to separate said two electronic components from each other in an electrically insulated manner, said plate member having opposite surfaces and at least one latch region having a first latch member formed in at least one of the opposite surfaces;

said securing member having a second latch member and a securing portion to secure said electronic component; and said plate member being constructed such that said securing member can be fitted on said latch region and said second latch member can engage with said first latch member to secure at least one of said electronic components.

12. A securing member adapted to be fitted on a separating plate having at least one latch region on a surface arranged to have a parallel relationship with faces of an electronic component being secured, said one latch region having a first latch member, said securing member comprising:

a body adapted to be fitted on said latch region of said separating plate;

a second latch member, having a parallel relationship with faces of an electronic component being secured, engageable with said first latch member of said separating plate; and a securing portion to secure an electronic component arranged in proximity to said separating plate.

13. A securing member according to claim 12, wherein said body comprises first and second opposed panels, arranged to oppose said surfaces of the separating plate which are in a parallel relationship with said electronic component, and a connecting wall connecting respective one ends of said first and second panels so that said securing member can be snap-fitted on said separating plate, said second latch member being arranged in one of said first and second panels, said securing portion being arranged in one of said first and second panels to outwardly protrude therefrom to secure an upper edge of said electronic component.

14. A securing member according to claim 12, wherein said second latch member is constructed such that said securing member can be fitted on said separating plate in a first direction but cannot be moved in a second direction opposite to said first direction when said second latch member is engaged with said first latch member.

15. An electronic apparatus comprising:

a casing;

at least one fixing member arranged in said casing;

at least one separating plate fixed to said fixing member in said casing and comprising a plate member made of an electrically insulating material;

a first connector arranged in said casing on one side of said separating plate in proximity to said separating plate;

an electronic component coupled to said first connector;

a second connector arranged in said casing on the other side of said separating plate in proximity to said separating plate; and a securing member attached to said separating plate and having a securing portion to secure said electronic component coupled to said first connector, wherein said separating plate has opposite surfaces, having at least one latch region having a latch member, in parallel relationship with faces of said electronic component being secured.

16. An electronic apparatus comprising:

a casing;

at least one fixing member arranged in said casing;

at least one separating plate fixed to said fixing member in said casing and comprising a plate member made of an electrically insulating material;

a first connector arranged in said casing on one side of said separating plate in proximity to said separating plate;

an electronic component coupled to said first connector;

a second connector arranged in said casing on the other side of said separating plate in proximity to said separating plate; and a securing member attached to said separating plate and having a securing portion to secure said electronic component coupled to said first connector, wherein said plate member has opposite surfaces and at least one latch region having a first latch member formed in at least one of the opposite surfaces;

said securing member has a second latch member; and said plate member is constructed such that said securing member can be fitted on said latch region and said second latch member can engage with said first latch member to secure said electronic component.

17. An electronic apparatus comprising:

a casing;

at least one fixing member arranged in said casing;

at least one separating plate fixed to said fixing member in said casing and comprising a plate member made of an electrically insulating material;

a first connector arranged in said casing on one side of said separating plate in proximity to said separating plate;

an electronic component coupled to said first connector;

a second connector arranged in said casing on the other side of said separating plate in proximity to said separating plate;

an electronic component coupled to said second connector; and a securing member attached to said separating plate and having a securing portion to secure said electronic component coupled to said first connector.

18. An electronic apparatus according to claim 15, wherein said separating plate and said electronic component are arranged in a facing relationship.

* * * * *